United States Patent
Mann et al.

(10) Patent No.: US 9,459,539 B2
(45) Date of Patent: Oct. 4, 2016

(54) IMAGING OPTICAL UNIT FOR A PROJECTION EXPOSURE APPARATUS

(71) Applicant: Carl Zeiss SMT GmbH, Oberkochen (DE)

(72) Inventors: Hans-Juergen Mann, Oberkochen (DE); Christoph Menke, Oberkochen (DE); Susanne Beder, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 368 days.

(21) Appl. No.: 13/956,770

(22) Filed: Aug. 1, 2013

(65) Prior Publication Data
US 2014/0038110 A1    Feb. 6, 2014

Related U.S. Application Data

(63) Continuation-in-part of application No. PCT/EP2012/065022, filed on Aug. 1, 2012.

(51) Int. Cl.
*G03F 7/20* (2006.01)
*G02B 17/06* (2006.01)

(52) U.S. Cl.
CPC ........... *G03F 7/70233* (2013.01); *G02B 17/06* (2013.01); *G02B 17/0663* (2013.01); *G03F 7/7015* (2013.01)

(58) Field of Classification Search
CPC ........... G03F 7/70233; G03F 7/70225; G03F 7/702; G03F 7/7015; G02B 17/06; G02B 17/0663
USPC .......................................................... 355/67
See application file for complete search history.

(56) References Cited

U.S. PATENT DOCUMENTS

| | | | |
|---|---|---|---|
| 5,815,310 A * | 9/1998 | Williamson | G02B 17/0657 359/365 |
| 7,414,781 B2 | 8/2008 | Mann et al. | |
| 7,999,913 B2 | 8/2011 | Mann | |
| 8,094,380 B2 | 1/2012 | Mann | |
| 2006/0098273 A1* | 5/2006 | Takahashi | G02B 17/0657 359/365 |
| 2006/0198039 A1* | 9/2006 | Sasaki | G02B 17/0636 359/857 |
| 2007/0058269 A1 | 3/2007 | Mann et al. | |
| 2009/0079952 A1* | 3/2009 | Mann | G03F 7/70233 355/67 |
| 2009/0213345 A1* | 8/2009 | Mann | G03F 7/70075 355/53 |

(Continued)

FOREIGN PATENT DOCUMENTS

JP    2004-23020    1/2004
WO   WO 2012/013241   2/2012

OTHER PUBLICATIONS

The International Search Report and Written Opinion for corresponding Appl No. PCT/EP2012/065022, mailed Apr. 5, 2013.

*Primary Examiner* — Steven H Whitesell Gordon
(74) *Attorney, Agent, or Firm* — Fish & Richardson P.C.

(57) ABSTRACT

An imaging optical unit for a projection exposure apparatus serves for imaging an object field in an object plane into an image field in an image plane. The image field is arranged at a field distance from the object plane. The optical unit has a plurality of mirrors. The imaging optical unit has a wavefront aberration over the image field of a maximum of 0.3 nm and an image-side numerical aperture of at least 0.5. The image field in at least one dimension has an extent of at least 10 mm. The result is an imaging optical unit in particular suited as part of an optical system for a projection exposure apparatus for projection lithography.

20 Claims, 6 Drawing Sheets

(56) References Cited

U.S. PATENT DOCUMENTS

Figure 1:
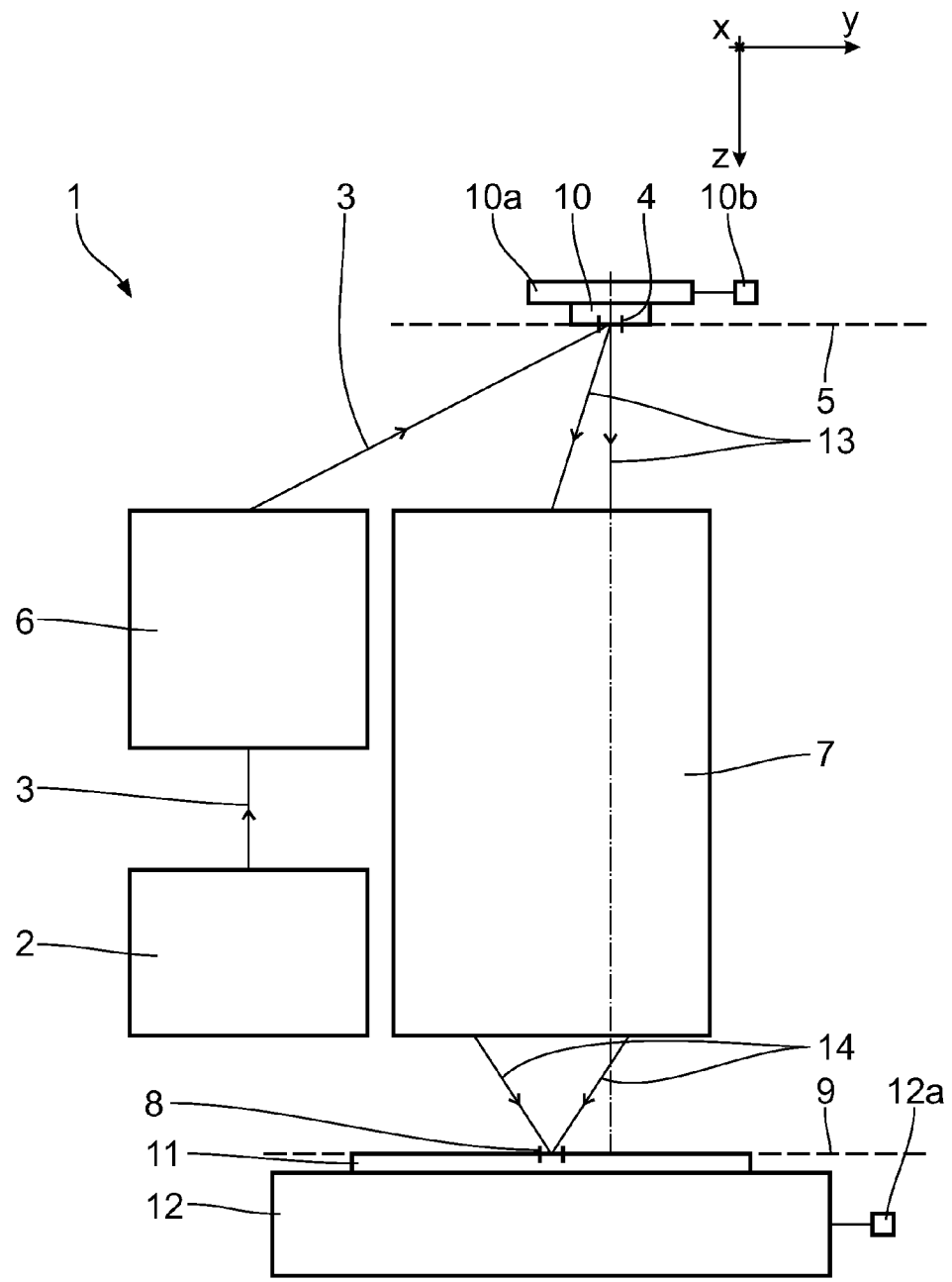

2011/0026003 A1* 2/2011 Zellner .............. G03F 7/70233 355/71

2011/0122384 A1* 5/2011 Mann .................. G03F 7/70233 355/66

2011/0292367 A1 12/2011 Mann

\* cited by examiner

IMAGING OPTICAL UNIT FOR A PROJECTION EXPOSURE APPARATUS

CROSS-REFERENCE TO RELATED APPLICATION

The present application is a continuation-in-part of, and claims priority under 35 USC 120 to, international application PCT/EP2012/065022, filed Aug. 1, 2012, the entire disclosure of which is incorporated by reference herein.

FIELD

The disclosure relates to an imaging optical unit for a projection exposure apparatus, an optical system including such an imaging optical unit, a projection exposure apparatus including such an optical system, a method for producing a micro- or nanostructured component using such a projection exposure apparatus, and a micro- or nanostructured component produced by such a method.

BACKGROUND

Imaging optical units for a projection exposure apparatus are known from, for example, U.S. Pat. No. 8,094,380, WO 2012/013241A, U.S. Pat. No. 7,999,913 B2 and JP 2004-23020 A.

SUMMARY

The disclosure provides an imaging optical unit which is in particular suited as part of an optical system for a projection exposure apparatus for projection lithography.

In aspect, the disclosure provides an imaging optical unit for a projection exposure apparatus for imaging an object field in an object plane into an image field in an image plane, wherein the image field is arranged at a field distance from the object plane. The unit imaging optical includes a plurality of mirrors. The imaging optical unit has a wavefront aberration over the image field of a maximum of 0.3 nm. The image field in at least one dimension has an extent of at least 10 mm including an image-side numerical aperture of more than 0.5.

An imaging optical unit having low wavefront aberration over an extended image field and a high image-side numerical aperture gives the possibility to produce high quality images even of objects with very small structures, i.e. structures having a typical dimension below 100 nm or even below 50 nm or 30 nm and even below that boundary. The parameter wavefront aberration is defined in U.S. Pat. No. 7,414,781.

The image field in at least one dimension may have an extent of at least 13 mm. In another dimension perpendicular to this extension dimension, the image field may have an extent of at least 1 mm, e.g. 1 mm, 1.5 mm, 2 mm, 2.5 mm, 3 mm or a larger extent.

In some embodiments, it possible to establish an imaging beam path having small folding angles resulting in a guidance of imaging light having low angles of incidence and/or low differences between a minimum angle of incidence and a maximum angle of incidence on each of the mirrors. Having all odd mirrors arranged in the image region results in a beam path where none of these odd mirrors is arranged back to back with that mirror which defines the position of the image-side intermediate plane. The used reflection surface of the last mirror in the imaging beam path may define the position of the image-side intermediate plane. Counting of the mirrors to define whether a mirror is an odd mirror or an even mirror starts at the object plane. Therefore, the first, the third, the fifth mirror and so in the imaging beam path after the object plane is an odd mirror and the second, the fourth mirror and so on are even mirrors in the beam path.

Therefore, it is possible to develop an imaging optical unit in such a way that angles of incidence on the mirrors of the imaging optical unit are kept as small as possible, that is to say close to normal incidence, or that an angle-of-incidence bandwidth on the mirrors is as small as possible, in order to achieve the highest possible imaging light throughput of the imaging optical unit.

In some embodiments, a large intermediate region has the effect that the at least two beam path sections which completely pass through the intermediate region are correspondingly long. Long beam path sections in turn result in the possibility of guidance of the imaging beam path in the case of which angle-of-incidence differences between the individual rays impinging on in each case a specific one of the mirrors are of no great consequence. This results in the possibility of a design of the imaging optical unit having small angles of incidence and/or having a bandwidth of angles of incidence that is small on the individual mirrors. Insofar as the image plane of the imaging optical unit runs parallel to the object plane, the image reference plane coincides with the image plane. The imaging optical unit can be a catoptric imaging optical unit. The imaging optical unit can have exactly eight mirrors or exactly six mirrors. The distance between the object-side intermediate plane and the image-side intermediate plane can be at least 45% or can be at least 50% of the field distance. At least three, at least four, at least five, at least six or at least seven beam path sections can pass completely through the intermediate region. The arrangement of the last mirror in the imaging beam path upstream of the image field in the image region, that is to say beyond the image-side intermediate plane as seen from the object plane, ensures that the imaging optical unit can be realized with a sufficiently large image-side numerical aperture. As an alternative or in addition to the arrangement of the last mirror in the imaging beam path upstream of the image field in the image region, the imaging optical unit according to the disclosure can have an image-side numerical aperture of at least 0.2. The numerical image-side aperture can be at least 0.25, can be at least 0.3, can be at least 0.35, can be at least 0.4, or can be at least 0.45 or may be even larger.

An object region appropriately dimensioned and/or an image region appropriately dimensioned result(s) in the possibility of using an intermediate region having particularly large dimensions in comparison with the field distance. The distance between the object plane and the object-side intermediate plane can be at most 35%, can be at most 30%, can be at most 25%, or can be at most 20%, of the field distance. The distance between the image-side intermediate plane and the image field or the image field reference plane can be at most 45%, can be at most 40%, can be at most 35%, or can be at most 30%, of the field distance.

Relatively small imaging aberrations can result in an imaging optical unit having a particularly high imaging quality. Definitions of the imaging aberrations can be found in U.S. Pat. No. 7,414,781. The wavefront aberration may have a maximum of 8 mλ, 7 mλ, 6 mλ taking into account a useful wavelength of imaging light of at most 20 nm. An absolute wavefront aberration may have a maximum of 0.16 nm, 0.14 nm or 0.12 nm. The wavefront aberration may be below that boundary.

An image-side numerical aperture of at least 0.55 can enable a particularly good structure resolution of the imaging optical unit. The image-side numerical aperture can be least 0.6, can be at least 0.65 or can be at least 0.7.

An image field extent of at least 1 mm×1 mm has been found to be particularly suitable for use within a projection exposure apparatus. The image field extent can be rectangular, in particular, wherein a longer side of the rectangular image field can then be at least 2 mm, at least 5 mm, at least 10 mm, and for example 13 mm. The shorter rectangle side of the image field can run along a scanning direction in the case of a projection exposure apparatus that operates in scanning fashion.

The advantages of an optical system, a projection exposure apparatus, a production method, and of a micro- or nanostructured component can correspond to those which have already been discussed in connection with the imaging optical unit according to the disclosure.

The advantages of the imaging optical unit are manifested particularly well in the case of an EUV projection exposure apparatus, in particular having a wavelength of the illumination and imaging light in the range of between 5 nm and 30 nm.

Figure 2:
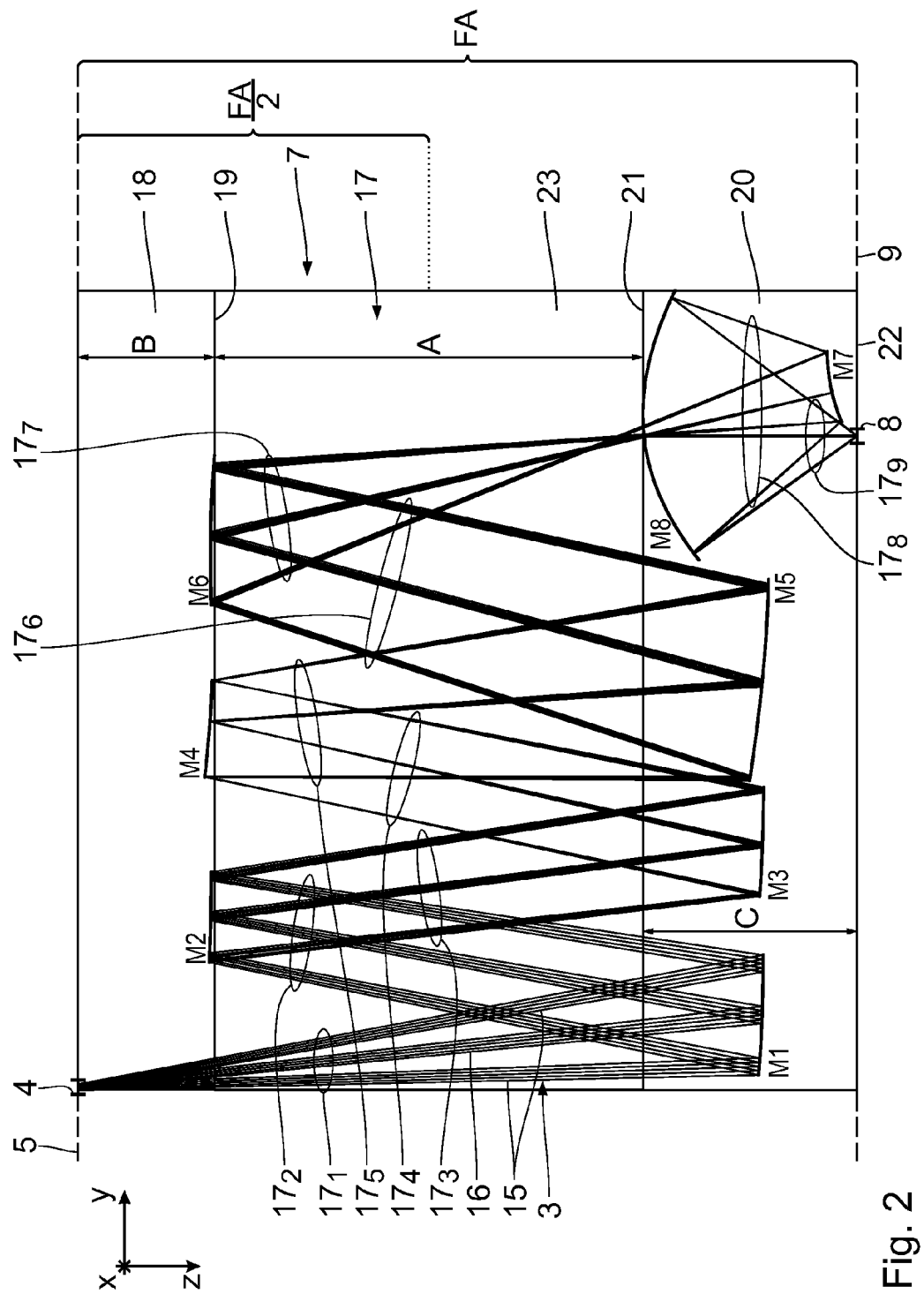
Figure 3:
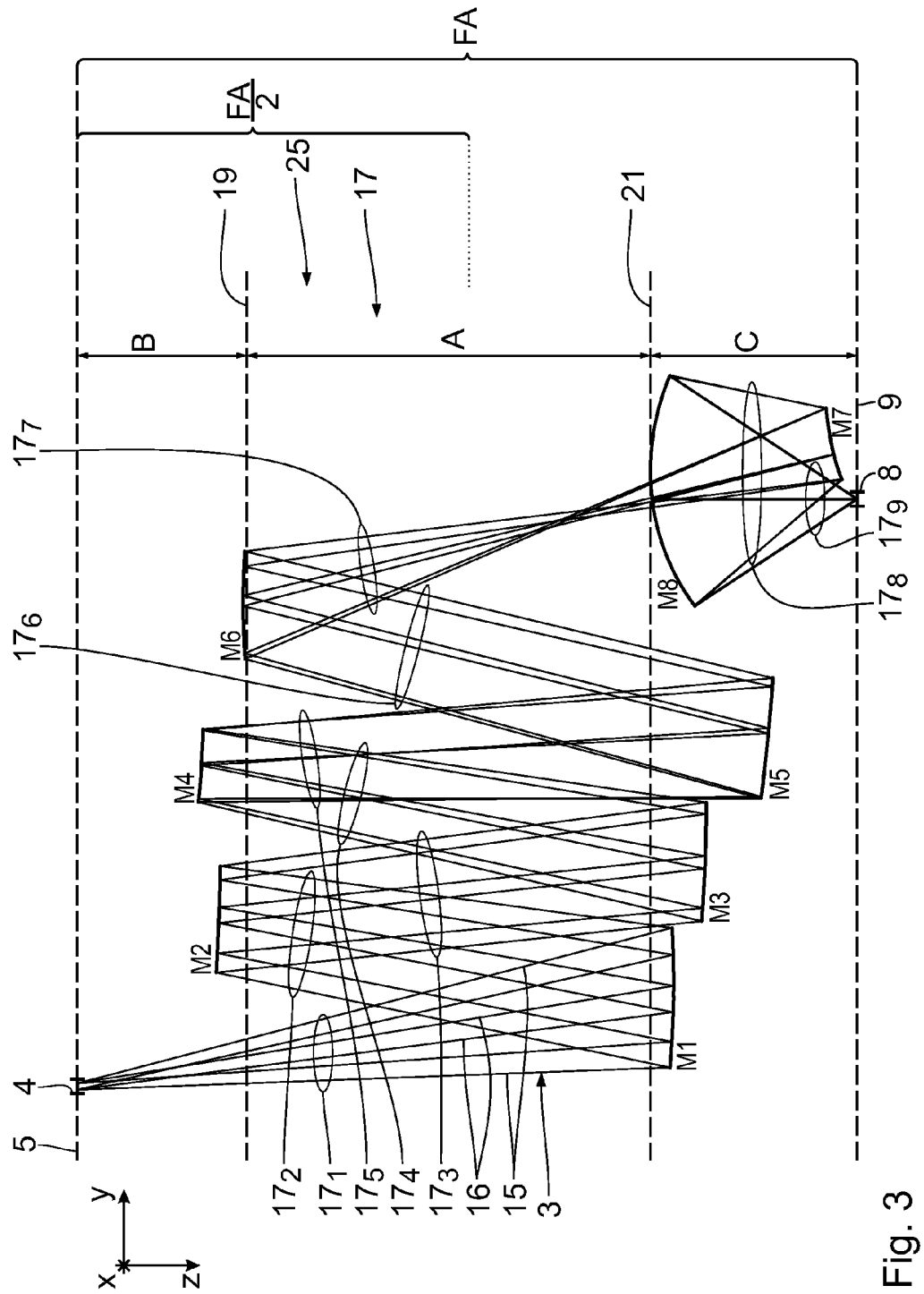
Figure 4:
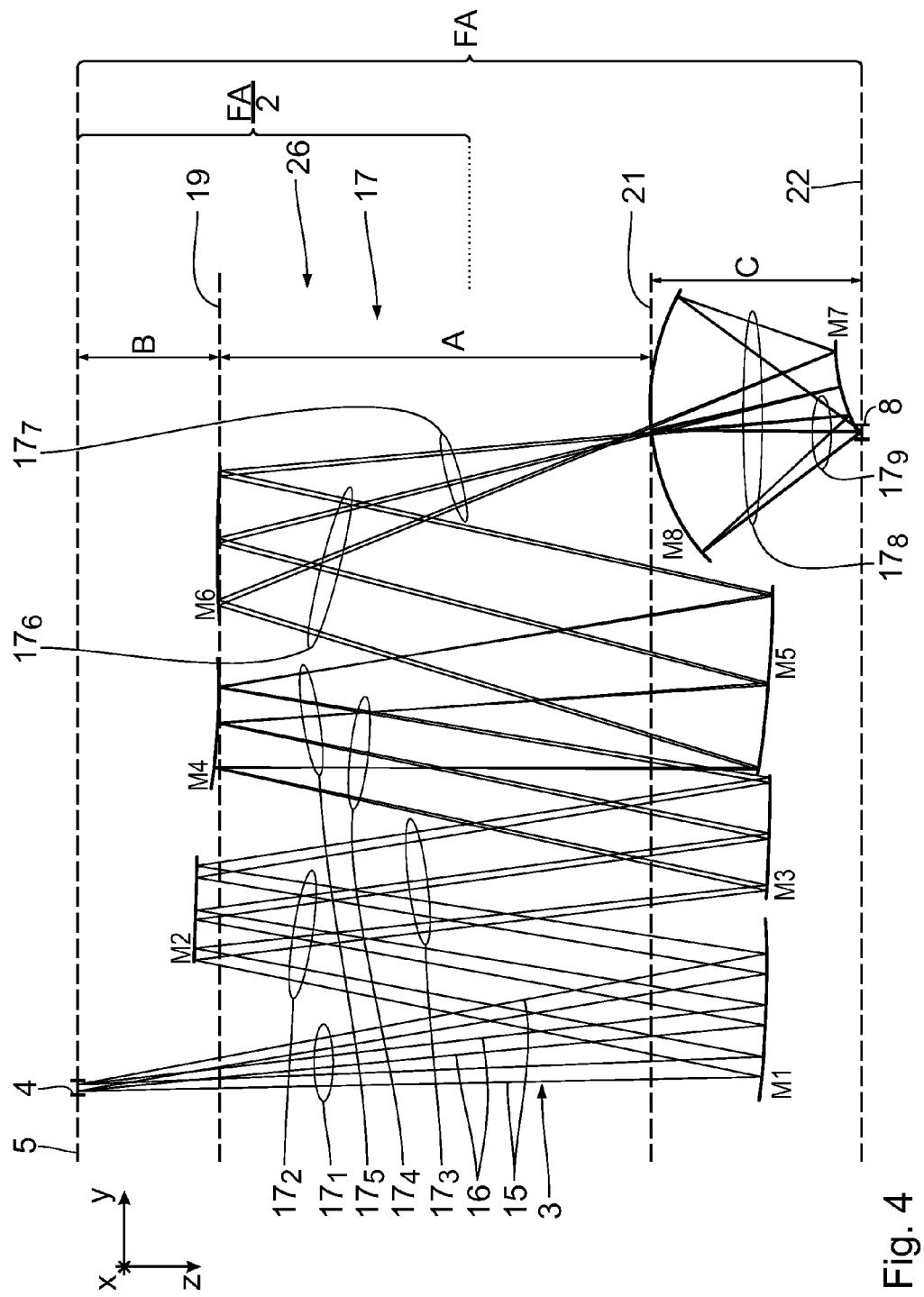
Figure 5:
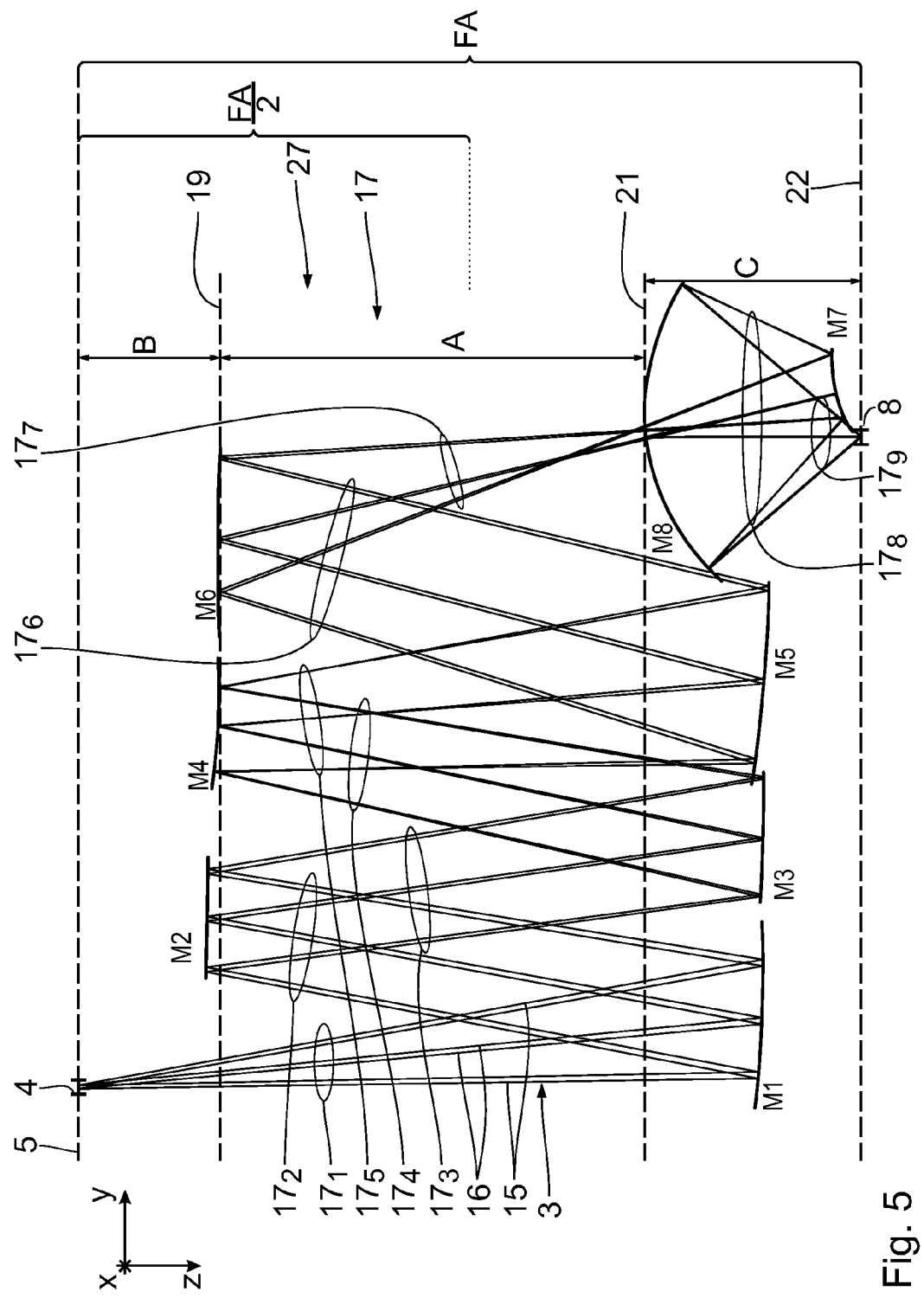
Figure 6:
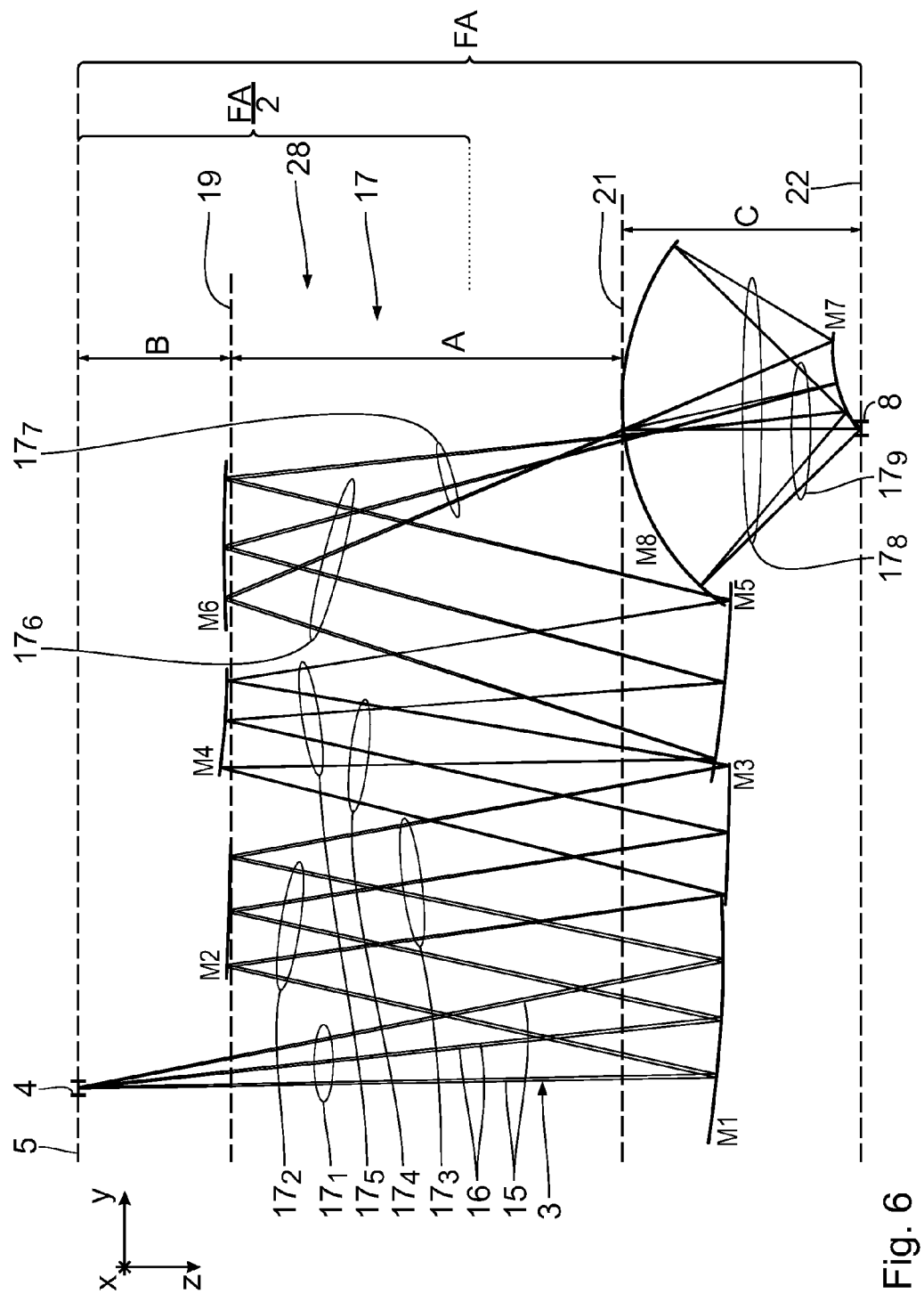

Exemplary embodiments of the disclosure are explained in more detail below with reference to the drawing, in which:

FIG. 1 schematically shows a projection exposure apparatus for EUV microlithography;

FIG. 2 shows in a meridional section an embodiment of an imaging optical unit which can be used as a projection lens in the projection exposure apparatus according to FIG. 1, wherein an imaging beam path for chief rays and for an upper and a lower coma ray of four selected field points spaced apart from one another is illustrated; and FIG. 3 shows in an illustration similar to FIG. 2 a further embodiment of an imaging optical unit; and FIGS. 4 to 6 show in an illustration similar to FIG. 2 further embodiments of an imaging optical unit.

A projection exposure apparatus 1 for microlithography has a light source 2 for illumination light or imaging light 3. The light source 2 is an EUV light source that generates light in a wavelength range of, for example, between 5 nm and 30 nm, in particular between 5 nm and 15 nm. The light source 2 can be, in particular, a light source having a wavelength of 13.5 nm or a light source having a wavelength of 6.9 nm. Other EUV wavelengths are also possible. In general, even arbitrary wavelengths, for example visible wavelengths or else other wavelengths which can be used in microlithography and for which suitable laser light sources and/or LED light sources are available (for example 365 nm, 248 nm, 193 nm, 157 nm, 129 nm, 109 nm), are possible for the illumination light 3 guided in the projection exposure apparatus 1. A beam path of the illumination light 3 is illustrated extremely schematically in FIG. 1.

An illumination optical unit 6 serves for guiding the illumination light 3 from the light source 2 toward an object field 4 in an object plane 5. A projection optical unit or imaging optical unit 7 is used to image the object field 4 into an image field 8 in an image plane 9 with a predefined reduction scale. The image field 8 has an extent of 13 mm in the x-direction and an extent of 2 mm in the y-direction. The object field 4 and the image field 8 are rectangular. One of the exemplary embodiments illustrated in FIGS. 2 and 3 can be used for the projection optical unit 7. The projection optical unit 7 according to FIG. 2 reduces by a factor of 8. Other reduction scales are also possible, for example 4×, 5×, or else reduction scales that are greater than 8×. The image plane 9 is arranged parallel to the object plane 5 in the case of the projection optical unit 7 in the embodiments according to FIGS. 2 and 3. A portion of a reflective reflection mask 10, also designated as a reticle, which coincides with the object field 4 is imaged in this case. The reticle 10 is carried by a reticle holder 10a. The reticle holder 10a is displaced by a reticle displacement drive 10b.

The imaging by the projection optical unit 7 is effected onto the surface of a substrate 11 in the form of a wafer that is carried by a substrate holder 12. The substrate holder 12 is displaced by a wafer or substrate displacement drive 12a.

FIG. 1 schematically illustrates, between the reticle 10 and the projection optical unit 7, a beam 13 of the illumination light 3 that enters into the projection optical unit, and, between the projection optical unit 7 and the substrate 11, a beam 14 of the illumination light 3 that emerges from the projection optical unit 7. An image-field-side numerical aperture (NA) of the projection optical unit 7 is not represented to scale in FIG. 1.

In order to facilitate the description of the projection exposure apparatus 1 and of the various embodiments of the projection optical unit 7, a Cartesian xyz coordinate system is indicated in the drawing, and reveals the respective positional relationship of the components illustrated in the figures. In FIG. 1, the x-direction runs perpendicularly to the plane of the drawing into the latter. The y-direction runs toward the right and the zdirection runs downward.

The projection exposure apparatus 1 is of the scanner type. Both the reticle 10 and the substrate 11 are scanned in the y-direction during operation of the projection exposure apparatus 1. A stepper type of the projection exposure apparatus 1, in the case of which a stepwise displacement of the reticle 10 and of the substrate 11 in the y-direction is effected between individual exposures of the substrate 11, is also possible. These displacements are effected in a manner synchronized with one another by corresponding driving of the displacement drives 10b and 12a.

FIG. 2 shows the optical design of a first embodiment of the projection optical unit 7. FIG. 2 illustrates the beam path in each case of three individual rays 15 proceeding from four object field points that are spaced apart from one another in the y-direction in FIG. 2. The illustration shows chief rays 16, that is to say individual rays 15 running through the center of a pupil in a pupil plane of the projection optical unit 7, and in each case an upper and a lower coma ray of these two object field points. A chief ray angle of the chief rays 16, which proceed centrally from the object field 4, with respect to the z-axis is 6.0°. The projection optical unit 7 can therefore be used for imaging a reflective object.

The object plane 5 lies parallel to the image plane 9. A field distance FA of the imaging optical unit 7 is defined as the distance between the image field 8 and the object plane 5. Since the object plane 5 runs parallel to the image plane 9 in the case of the imaging optical unit 7, the distance between the object plane 5 and the image plane 9 is simultaneously also the field distance FA.

The projection optical unit 7 according to FIG. 2 has a total of eight mirrors, which are numbered consecutively by M1 to M8 in the order of the beam path of the individual rays 15, proceeding from the object field 4. The imaging optical unit 7 can also have a different number of mirrors, for example six mirrors. FIG. 2 illustrates the calculated reflection surfaces of the mirrors M1 to M8. As can be seen in the illustration according to FIG. 2, only a partial region of the calculated reflection surfaces is used. Only this actually used region of the reflection surfaces is actually present in the real mirrors M1 to M8. These used reflection surfaces are carried by mirror bodies in a known manner.

Apart from the mirror M8, all mirrors M1 to M7 of the projection optical unit 7 have a reflection surface that is used continuously without a through opening for the imaging light 3. In particular the penultimate mirror M7 in the imaging beam path between the object field 4 and the image field 8 has a reflection surface which is used in closed fashion, that is to say in a manner free of openings.

An aperture stop of the imaging optical unit 7 is divided in two. In the plane of the drawing, that is to say meridionally, a ray limitation of the illumination light 3 is effected on the mirror M8. Perpendicularly to the plane of the drawing in FIG. 2, that is to say sagittally, a limitation of the beam of illumination light 3 is effected on the mirror M3. These respective aperture limitations are realized via a corresponding coating on the respective mirror M3, M8 or via an aperture stop arranged there.

The mirrors M1 to M8 bear multiple reflection layers for optimizing their reflection for the impinging EUV illumination light 3. The multiple reflection layers are designed for an operating wavelength of 13.5 nm. The reflection can be optimized all the better, the closer the impingement angle of the individual rays 15 on the mirror surface is to normal incidence or the smaller a bandwidth of angles of incidence of the individual rays 15 of the imaging light 3 on in each case one of the mirrors M1 to M8. The projection optical unit 7 has small reflection angles overall for all individual rays 15. The maximum angle of incidence on mirror M7 is 22.7°. The maximum angle of incidence with respect to the mirrors M1 to M6 is 19.8° on mirror M6. The angles of incidence on all other mirrors M1 to M5 and also on mirror M8 are smaller than 12.9°. The maximum angle of incidence on the mirror M8 is 8.7°.

All eight mirrors M1 to M8 of the projection optical unit 7 can be embodied as freeform surfaces which cannot be described by a rotationally symmetrical function. Other embodiments of the projection optical unit 7 are also possible in which at least one or else none of the mirrors M1 to M8 has a freeform reflection surface of this type.

A freeform surface of this type can be produced from a rotationally symmetrical reference surface. Freeform surfaces of this type for reflection surfaces of the mirrors of projection optical units of projection exposure apparatuses for microlithography are known from US 2007-0058269 A1.

The freeform surface can be described mathematically by the following equation:

$$Z = \frac{cr^2}{1 + \sqrt{1 - (1+k)c^2 r^2}} + \sum_{j=2}^{N} C_j X^m Y^n$$

wherein the following holds true:

$$j = \frac{(m+n)^2 + m + 3n}{2} + 1$$

Z is the sagittal of the freeform surface at the point x, y ($x^2+y^2=r^2$).

c is a constant corresponding to the vertex curvature of a corresponding asphere (radius=1/c). k corresponds to a conical constant of a corresponding asphere. $C_j$ are the coefficients of the monomials $X^m Y^n$. The values of c, k and $C_j$ are typically determined on the basis of the desired optical properties of the mirror within the projection optical unit 7. The order of the monomial, m+n, can be varied as desired. A higher-order monomial can lead to a design of the projection optical unit with better image aberration correction, but is more complex to calculate. m+n can assume values of between 3 and more than 20.

Freeform surfaces can also be described mathematically by Zernike polynomials which are explained for example in the manual of the optical design program CODE V®. Alternatively, freeform surfaces can be described with the aid of two-dimensional spline surfaces. Examples thereof are Bezier curves or non-uniform rational basis splines (NURBS). Two-dimensional spline surfaces can be described for example by a network of points in an xy plane and associated z values or by these points and gradients associated with them. Depending on the respective type of spline surface, the complete surface is obtained by interpolation between the network points using e.g. polynomials or functions which have specific properties with regard to their continuity and differentiability. Examples thereof are analytical functions.

The following table specifies, with respect to the optical surfaces of the mirrors M1 to M8, in the first section of the table, in each case the reciprocal of the vertex curvature (radius) and, additionally also for the image plane 9, in the third section of the table, a distance value (thickness) corresponding to the z distance from the preceding element in the beam path, proceeding from the object plane 5. The second section of the table specifies the coefficients $C_j$ of the monomials $X^m Y^n$ in the freeform surface equation specified above for the mirrors M1 to M8 sorted for the powers m and n. The third section of the table also specifies the absolute value in mm along which the respective mirror, proceeding from a reference axis passing through a center of the object field 4 and running parallel to the z-axis, was decentered (y-distance from the object field center) and rotated about an axis parallel to the x-axis (tilting with respect to the object plane). This corresponds to a parallel displacement and a tilting in the case of the freeform surface design method. In this case, displacement is effected in the y-direction and tilting is effected about the x-axis. In this case, the angle of rotation is specified in degrees.

| | | M1 | M2 | M3 |
|---|---|---|---|---|
| | | | Radius | |
| | | −2950.842075 | 4975.610285 | −6366.110078 |
| | | | conical constant | |
| m | n | 0 | 0 | 0 |
| 2 | 0 | −7.381224E−05 | 1.172528E−03 | −7.556204E−05 |
| 0 | 2 | −9.208568E−06 | 3.754301E−05 | −2.219463E−05 |
| 2 | 1 | 2.727501E−09 | −9.292232E−08 | −6.784310E−08 |
| 0 | 3 | −5.407935E−09 | −5.488799E−08 | 1.026298E−07 |
| 4 | 0 | −1.181461E−11 | 4.107539E−09 | 3.605526E−11 |
| 2 | 2 | −1.613525E−11 | 6.744130E−10 | 2.385286E−11 |
| 0 | 4 | 3.162780E−11 | −6.058593E−10 | 4.241097E−10 |
| 4 | 1 | 6.612387E−16 | −1.897817E−12 | −3.987511E−14 |
| 2 | 3 | −2.198859E−15 | −2.713492E−14 | 4.342494E−14 |
| 0 | 5 | 1.071796E−14 | −2.460968E−13 | 7.978910E−13 |
| 6 | 0 | −2.071588E−18 | 3.238261E−14 | 3.578675E−17 |
| 4 | 2 | −4.517917E−18 | 6.715560E−15 | 2.881052E−17 |
| 2 | 4 | 5.653850E−19 | −3.287170E−15 | 1.939193E−16 |
| 0 | 6 | −5.442037E−17 | 3.797802E−15 | 1.875164E−15 |
| 6 | 1 | 9.701015E−23 | −4.878901E−17 | −3.804973E−20 |
| 4 | 3 | −5.366992E−22 | −5.560271E−18 | 6.860176E−20 |
| 2 | 5 | 1.331189E−20 | −9.099685E−18 | 6.138495E−19 |
| 0 | 7 | 5.685822E−20 | 2.278574E−16 | 4.831172E−18 |
| 8 | 0 | −4.386339E−25 | 2.258072E−20 | −1.771219E−23 |

-continued

| m | n | | | |
|---|---|---|---|---|
| 6 | 2 | −4.827488E−24 | 3.618285E−19 | 4.335482E−23 |
| 4 | 4 | 1.996777E−23 | 1.376532E−19 | −3.618374E−23 |
| 2 | 6 | −1.277830E−22 | 1.053616E−19 | 5.193798E−22 |
| 0 | 8 | 4.088478E−21 | −2.264094E−19 | 3.391238E−20 |
| 8 | 1 | 1.385594E−27 | 2.715449E−21 | −3.137867E−26 |
| 6 | 3 | 2.493522E−26 | 3.605391E−22 | −1.652213E−25 |
| 4 | 5 | 2.058481E−26 | 3.720723E−22 | −3.430904E−25 |
| 2 | 7 | −6.623554E−25 | 5.519968E−22 | 8.046350E−24 |
| 0 | 9 | −1.555231E−24 | 6.665594E−23 | 9.633676E−23 |
| 10 | 0 | 7.263603E−31 | 5.263220E−23 | −5.818590E−29 |
| 8 | 2 | 9.636178E−29 | −3.035165E−23 | 7.493225E−30 |
| 6 | 4 | −5.555475E−29 | −6.115627E−23 | 5.651744E−28 |
| 4 | 6 | −5.309786E−28 | −1.650235E−23 | 8.049875E−27 |
| 2 | 8 | 4.790212E−27 | −5.380691E−24 | 5.032967E−26 |
| 0 | 10 | −6.945393E−26 | 7.323133E−24 | 2.894713E−25 |
| 10 | 1 | −7.752085E−33 | −1.860870E−25 | −9.495456E−32 |
| 8 | 3 | −1.993950E−31 | −9.655863E−25 | −5.672307E−31 |
| 6 | 5 | −4.997322E−31 | −1.481629E−26 | 1.690515E−30 |
| 4 | 7 | −4.229867E−31 | −9.610638E−27 | 3.890811E−31 |
| 2 | 9 | 8.690378E−30 | −1.191730E−26 | −1.252744E−30 |
| 0 | 11 | 4.615795E−30 | −1.722412E−28 | 1.117905E−27 |
| 12 | 0 | −4.021731E−36 | −3.096219E−27 | −8.527993E−35 |
| 10 | 2 | −5.963349E−34 | 1.493750E−28 | 2.432723E−34 |
| 8 | 4 | −1.075365E−33 | 4.809833E−27 | −1.456889E−33 |
| 6 | 6 | 1.821035E−33 | 2.714383E−27 | −1.511377E−32 |
| 4 | 8 | 4.271464E−34 | 5.249202E−28 | −1.955105E−31 |
| 2 | 10 | −6.413768E−32 | 1.141264E−28 | −2.044019E−31 |
| 0 | 12 | 4.542690E−31 | −9.273163E−29 | 2.135094E−30 |
| 12 | 1 | 0.000000E+00 | 0.000000E+00 | 0.000000E+00 |
| 10 | 3 | 0.000000E+00 | 0.000000E+00 | 0.000000E+00 |
| 8 | 5 | 0.000000E+00 | 0.000000E+00 | 0.000000E+00 |
| 6 | 7 | 0.000000E+00 | 0.000000E+00 | 0.000000E+00 |
| 4 | 9 | 0.000000E+00 | 0.000000E+00 | 0.000000E+00 |
| 2 | 11 | 0.000000E+00 | 0.000000E+00 | 0.000000E+00 |
| 0 | 13 | 0.000000E+00 | 0.000000E+00 | 0.000000E+00 |
| Thickness (z distance from the preceding surface) | | 1803.698247 | −1453.541515 | 1453.39132 |
| y distance from the object field center | | −190.635408 | −455.013891 | −651.077344 |
| Tilting with respect to the object plane | | −2.137754 | −1.312861 | −2.224551 |

| | | M4 | M5 | M6 |
|---|---|---|---|---|
| | | | Radius | |
| | | 7830.28291 | −5877.359738 | −3793.35402 |
| | | | conical constant | |
| m | n | 0 | 0 | 0 |
| 2 | 0 | −5.644739E−05 | 4.320816E−05 | −3.584710E−05 |
| 0 | 2 | 1.733089E−04 | −5.591985E−05 | −1.285689E−05 |
| 2 | 1 | −1.324454E−07 | 1.185655E−08 | 4.864183E−09 |
| 0 | 3 | −6.773727E−07 | 2.620997E−08 | −1.082639E−08 |
| 4 | 0 | −5.061693E−11 | 2.157625E−11 | −5.813120E−12 |
| 2 | 2 | −1.200615E−10 | 3.199578E−11 | −1.075859E−11 |
| 0 | 4 | 3.085973E−10 | 2.120347E−11 | −4.714616E−12 |
| 4 | 1 | 1.265610E−13 | 6.214673E−15 | −3.412727E−15 |
| 2 | 3 | 8.238005E−14 | 4.728410E−14 | −3.085447E−14 |
| 0 | 5 | 2.426347E−12 | 2.336536E−14 | −1.219062E−14 |
| 6 | 0 | 5.989400E−18 | 6.219341E−18 | −1.541569E−18 |
| 4 | 2 | −2.356720E−16 | 3.420879E−17 | −3.039888E−17 |
| 2 | 4 | −2.393190E−16 | 5.155667E−17 | −2.528659E−17 |
| 0 | 6 | −2.719366E−14 | 2.011524E−17 | 1.410728E−17 |
| 6 | 1 | −8.530898E−20 | 9.540714E−21 | −1.432656E−20 |
| 4 | 3 | 5.595268E−20 | 7.638480E−20 | −1.306859E−19 |
| 2 | 5 | 8.543170E−18 | 7.539325E−20 | −1.199295E−19 |
| 0 | 7 | 1.577960E−16 | 2.018160E−20 | 8.649141E−20 |
| 8 | 0 | −2.598018E−24 | 7.374631E−24 | −1.521189E−23 |
| 6 | 2 | 4.195161E−22 | 3.453850E−23 | −1.139754E−22 |
| 4 | 4 | 9.564583E−22 | 8.911496E−23 | −4.298072E−22 |

| m | n | | | |
|---|---|---|---|---|
| 2 | 6 | −9.629256E−20 | 2.613506E−22 | −6.641406E−22 |
| 0 | 8 | −4.853789E−20 | −1.009910E−22 | 2.479826E−22 |
| 8 | 1 | 4.847077E−26 | 1.655409E−26 | −1.285177E−25 |
| 6 | 3 | 1.192298E−24 | −7.569537E−26 | −2.321273E−25 |
| 4 | 5 | −2.311191E−23 | 1.928567E−25 | −1.157227E−24 |
| 2 | 7 | 3.136084E−22 | 5.009656E−26 | 2.319255E−24 |
| 0 | 9 | −6.256923E−22 | −5.513967E−25 | −9.484650E−26 |
| 10 | 0 | 4.991244E−29 | −2.083510E−29 | 5.612184E−29 |
| 8 | 2 | −1.405177E−28 | −1.407282E−28 | −1.094631E−28 |
| 6 | 4 | −7.863113E−27 | −8.218663E−29 | −8.415821E−28 |
| 4 | 6 | 2.609723E−25 | 1.926277E−28 | 3.122552E−27 |
| 2 | 8 | −7.787134E−27 | −1.788464E−27 | 2.068239E−26 |
| 0 | 10 | −1.901163E−23 | 1.403565E−28 | −8.425745E−27 |
| 10 | 1 | 4.358818E−32 | −1.323173E−31 | 6.740977E−31 |
| 8 | 3 | −3.762212E−30 | −3.053195E−31 | −4.997772E−31 |
| 6 | 5 | −8.065937E−30 | 3.547681E−31 | −1.711467E−30 |
| 4 | 7 | −6.457302E−28 | 8.462125E−32 | 2.786566E−29 |
| 2 | 9 | 4.007407E−28 | −2.956009E−30 | 1.957499E−29 |
| 0 | 11 | 1.184473E−25 | 3.853633E−30 | −2.229539E−29 |
| 12 | 0 | −7.076241E−35 | −7.404580E−36 | 5.190574E−35 |
| 10 | 2 | −7.288117E−34 | −1.103698E−34 | 1.180351E−33 |
| 8 | 4 | 1.001072E−32 | −4.429141E−34 | −3.427515E−34 |
| 6 | 6 | −1.443987E−31 | 1.764489E−33 | −9.196823E−33 |
| 4 | 8 | −2.495559E−30 | −2.220577E−33 | 7.374252E−32 |
| 2 | 10 | −3.883935E−30 | 2.524720E−33 | −8.784391E−32 |
| 0 | 12 | −2.003945E−28 | 3.706893E−33 | 1.331022E−32 |
| 12 | 1 | 0.000000E+00 | 0.000000E+00 | 0.000000E+00 |
| 10 | 3 | 0.000000E+00 | 0.000000E+00 | 0.000000E+00 |
| 8 | 5 | 0.000000E+00 | 0.000000E+00 | 0.000000E+00 |
| 6 | 7 | 0.000000E+00 | 0.000000E+00 | 0.000000E+00 |
| 4 | 9 | 0.000000E+00 | 0.000000E+00 | 0.000000E+00 |
| 2 | 11 | 0.000000E+00 | 0.000000E+00 | 0.000000E+00 |
| 0 | 13 | 0.000000E+00 | 0.000000E+00 | 0.000000E+00 |
| Thickness (z distance from the preceding surface) | | −1453.547442 | 1453.516353 | −1453.286626 |
| y distance from the object field center | | −963.557055 | −1064.104617 | −1452.194253 |
| Tilting with respect to the object plane | | −4.087406 | −5.497196 | −0.945767 |

| | | M7 | M8 | |
|---|---|---|---|---|
| | | | Radius | |
| | | 641.834011 | −617.405394 | |
| | | | conical constant | |
| m | n | 2.031957 | 0.020944 | Image plane |
| 2 | 0 | −3.811994E−04 | 4.165009E−05 | |
| 0 | 2 | 2.789377E−04 | −1.860402E−06 | |
| 2 | 1 | −1.229839E−06 | −6.934534E−08 | |
| 0 | 3 | 4.468617E−07 | −3.254154E−08 | |
| 4 | 0 | 5.911157E−10 | 2.472753E−11 | |
| 2 | 2 | −1.383762E−10 | 1.024964E−11 | |
| 0 | 4 | 9.585516E−10 | −1.529659E−11 | |
| 4 | 1 | −6.399622E−12 | −7.042391E−14 | |
| 2 | 3 | −2.035731E−12 | −1.728025E−13 | |
| 0 | 5 | 3.246251E−12 | −5.934669E−14 | |
| 6 | 0 | 8.401655E−15 | 1.895237E−17 | |
| 4 | 2 | 8.857784E−16 | 2.814341E−17 | |
| 2 | 4 | 2.860029E−14 | −4.987536E−17 | |
| 0 | 6 | 4.047763E−14 | −2.858511E−17 | |
| 6 | 1 | −7.051564E−17 | −1.060223E−19 | |
| 4 | 3 | −1.705021E−16 | −3.526346E−19 | |
| 2 | 5 | −2.489109E−16 | −2.980265E−19 | |
| 0 | 7 | −7.850409E−17 | −8.196680E−20 | |
| 8 | 0 | 1.079160E−19 | 9.602975E−23 | |
| 6 | 2 | −2.072698E−19 | 9.361860E−23 | |
| 4 | 4 | −3.802550E−19 | 3.220820E−23 | |
| 2 | 6 | −1.622167E−18 | −4.702332E−23 | |

-continued

| | | | | |
|---|---|---|---|---|
| 0 | 8 | −4.070387E−18 | −1.275171E−22 | |
| 8 | 1 | −3.380921E−22 | −1.015073E−26 | |
| 6 | 3 | −6.582271E−21 | −4.965033E−25 | |
| 4 | 5 | −7.415169E−21 | −6.090098E−25 | |
| 2 | 7 | 2.071928E−20 | −1.013341E−24 | |
| 0 | 9 | −3.229963E−20 | −1.109452E−25 | |
| 10 | 0 | 9.141393E−26 | 1.807036E−28 | |
| 8 | 2 | 6.309380E−24 | 4.198491E−28 | |
| 6 | 4 | −3.065420E−24 | 2.429069E−28 | |
| 4 | 6 | 2.078742E−23 | −7.104489E−28 | |
| 2 | 8 | 2.239132E−22 | −5.203767E−28 | |
| 0 | 10 | −9.340445E−24 | −2.736324E−28 | |
| 10 | 1 | −4.091728E−27 | 6.415743E−33 | |
| 8 | 3 | 7.326703E−26 | −7.380451E−31 | |
| 6 | 5 | 2.859895E−25 | −2.492697E−30 | |
| 4 | 7 | 3.880058E−25 | −4.585103E−30 | |
| 2 | 9 | −6.738107E−25 | −1.858734E−30 | |
| 0 | 11 | 1.040916E−24 | −1.610411E−31 | |
| 12 | 0 | 1.350182E−29 | −8.691297E−35 | |
| 10 | 2 | 7.827286E−29 | 1.425856E−33 | |
| 8 | 4 | 9.123858E−28 | 3.423612E−33 | |
| 6 | 6 | 2.438960E−27 | −4.074095E−34 | |
| 4 | 8 | 1.786993E−27 | −1.421077E−33 | |
| 2 | 10 | −1.037026E−26 | −2.742510E−33 | |
| 0 | 12 | 5.015549E−27 | 6.730306E−35 | |
| 12 | 1 | −3.277913E−31 | 9.420567E−38 | |
| 10 | 3 | −1.398932E−30 | 9.695651E−37 | |
| 8 | 5 | 7.052556E−31 | −7.796373E−37 | |
| 6 | 7 | 3.732463E−30 | −6.625532E−36 | |
| 4 | 9 | 4.093155E−30 | −4.445691E−37 | |
| 2 | 11 | −2.131504E−29 | 6.517745E−36 | |
| 0 | 13 | 8.296279E−30 | 2.103472E−37 | |
| Thickness (z distance from the preceding surface) | | 1638.189234 | −493.109 | 558.444407 |
| y distance from the object field center | | −1832.207819 | −1717.753358 | 0.000000 |
| Tilting with respect to the object plane | | 13.063888 | 6.521896 | 0.000000 |

The projection optical unit 7 is designed for guiding the imaging light 3 between the object field 4 and the image field 8 along an imaging beam path 17. Beam path sections $17_1$ to $17_9$ of the imaging beam path 17 run between the object field and the mirror M1 (beam path section $17_1$), between mirrors which succeed one another directly in the imaging beam path 17 (beam path sections $17_2$ to $17_8$) and between the mirror M8 and the image field 8 (beam path section $17_9$).

An object region 18 of the imaging optical unit 7 is bounded by the object plane 5 and an object-side intermediate plane 19 parallel thereto. The object-side intermediate plane 19 is that plane at the smallest distance from the object plane 5 for which it holds true that the used reflection surfaces of all mirrors M1 to M8 which are at a distance from the object plane 5 that is less than half of the field distance FA are arranged between the object plane 5 and the object-side intermediate plane 19. In the case of the imaging optical unit 7, the used reflections surfaces of the mirrors M2, M4 and M6 lie in the object region 18. In the case of the imaging optical unit 7, the mirror M6 defines the position of the object-side intermediate plane 19. The mirror M6 therefore has a used surface region which is used for reflection and is at the furthest distance from the object plane 5. This cannot be seen from the illustration in FIG. 2 since the used surface region of the mirror M6 which is at the furthest distance from the object plane 5 is removed from the meridional plane.

An image region 20 of the imaging optical unit 7 is bounded by an image-side intermediate plane 21, which is likewise parallel to the object plane 5, and an image field reference plane 22 containing a central image field point and parallel to the object plane 5. Since the image plane 9 runs parallel to the object plane 5 in the case of the imaging optical unit 7, the image plane and the image field reference plane 22 coincide.

The image-side intermediate plane 21 is that plane at the largest distance from the object plane 5 for which it holds true that, as seen from the direction of the object field 4, the used reflection surfaces of all mirrors which are at a distance from the object plane 5 that is greater than half of the field distance FA are arranged beyond the image-side intermediate plane 21. In the case of the imaging optical unit 7 according to FIG. 2, the used reflection surfaces of the mirrors M1, M3, M5, M7 and M8 lie in the image region 20. The exact position of the image-side intermediate plane 21, that is to say the distance thereof from the object plane 5, is predefined by the last mirror M8 in the case of the imaging optical unit according to FIG. 2.

An intermediate region 23 of the imaging optical unit 7 lies between the object-side intermediate plane 19 and the image-side intermediate plane 21. The distance A between the object-side intermediate plane 19 and the image-side intermediate plane 21 is approximately 50% of the field distance FA in the case of the imaging optical unit 7 according to FIG. 2. In alternative embodiments of the imaging optical unit 7, the distance A can also be 40% or 45% of the field distance FA. The distance A is therefore in the range of between 40% and 50% of the field distance FA.

Seven of the beam path sections $17_x$, namely the beam path sections $17_1$ to $17_7$, pass through the intermediate region 23 completely, that is to say between the intermediate planes 19 and 21. Only the two beam path sections $17_8$ and $17_9$ which run completely in the image region 20 do not pass through the intermediate region 23.

In alternative embodiments of the imaging optical unit 7, it is also possible for fewer sections of the imaging beam path 17 to completely pass through the intermediate region 23, for example two beam path sections $17_x$, three beam path sections $17_x$, four beam path sections $17_x$, five beam path sections $17_x$ or six beam path sections $17_x$. The beam path sections $17_x$ which completely pass through the intermediate region 23 do not have to be beam path sections $17_x$ which succeed one another directly in the imaging beam path 17.

In the case of the imaging optical unit 7 according to FIG. 2, a distance B between the object plane 5 and the object-side intermediate plane 19 is approximately 20% of the field distance FA. In alternative embodiments of the imaging optical unit 7, the distance B can be at most 25%, at most 30%, at most 35% or else at most 40% of the field distance A.

A distance C between the image-side intermediate plane 23 and the image field 8 is approximately 30% of the field distance FA in the case of the imaging optical unit 7. In alternative embodiments of the imaging optical unit 7, the distance C can be at most 35%, at most 40%, at most 45% or else at most 50% of the field distance.

The imaging optical unit 7 has a wavefront aberration of a maximum of 10 mλ and a distortion of at most 0.3 nm over the image field 8.

An image-side numerical aperture of the imaging optical unit 7 according to FIG. 2 is 0.6.

A further embodiment of an imaging optical unit 25 is described below with reference to FIG. 3, which can be used instead of the imaging optical unit 7. Components corresponding to those which have already been explained above with reference to the imaging optical unit 7 according to FIGS. 1 and 2 bear the same reference numerals and will not be discussed in detail again. FIG. 3 illustrates the beam path of in each case three individual rays 15 proceeding from two object field points spaced apart from one another in the y-direction in FIG. 3. The illustration once again shows the chief rays 16 and also an upper and a lower marginal or coma ray.

The imaging optical unit 25 has a reduction scale of 6×. An image-field-side numerical aperture of the imaging optical unit 25 is 0.55. The image field 8 has an extent of 26 mm in the x-direction, that is to say perpendicular to the plane of the drawing in FIG. 3, and an extent of 3 mm in the y-direction. The image field 8 is rectangular. The chief ray 16 of a central field point of the object field 4 has, proceeding from the object field 4, a chief ray angle with respect to the z-axis of 8.3°.

The imaging optical unit 25 also has a meridional aperture stop on the mirror M8. A sagittal aperture stop is arranged in the beam path between the mirrors M3 and M4 in the case of the imaging optical unit 25. The maximum angle of incidence on mirror M7 is 18.4°. The maximum angle of incidence with respect to the mirrors M1 to M6 is 19.2° on mirror M6. The angles of incidence on all other mirrors M1 to M5 and also on mirror M8 are smaller than 11.6°. The maximum angle of incidence on the mirror M8 is 10.9°.

The following table reproduces the optical design data with regard to the imaging optical unit 25. In terms of structure, this table corresponds in accordance with the structure of the table explained above with regard to the imaging optical unit 7.

|   |   | M1 | M2 | M3 |
|---|---|---|---|---|
|   |   |   | Radius |   |
|   |   | −2698.703988 | 5682.803719 | −5730.487805 |
|   |   |   | conical constant |   |
| m | n | 0 | 0.000003 | 0 |
| 2 | 0 | −3.206692E−05 | 5.531188E−04 | −7.762720E−05 |
| 0 | 2 | −7.105339E−08 | 1.735706E−07 | 1.332866E−08 |
| 2 | 1 | −1.172690E−08 | 5.302714E−07 | −1.096140E−07 |
| 0 | 3 | 4.068800E−08 | −1.887750E−07 | 7.501636E−08 |
| 4 | 0 | −8.368784E−12 | 7.424601E−10 | 2.435046E−11 |
| 2 | 2 | −1.556193E−11 | 2.874257E−11 | 4.571203E−11 |
| 0 | 4 | 3.200666E−11 | −4.264898E−11 | 7.081830E−11 |
| 4 | 1 | −1.236649E−15 | 1.797144E−12 | −7.881402E−14 |
| 2 | 3 | −6.209203E−15 | −2.836636E−14 | −4.359092E−14 |
| 0 | 5 | 3.244306E−14 | 8.443360E−14 | 6.373677E−14 |
| 6 | 0 | −1.663780E−18 | 2.198543E−15 | 2.194412E−17 |
| 4 | 2 | −2.574459E−18 | 1.021929E−15 | 9.423257E−17 |
| 2 | 4 | −3.796305E−18 | −2.647808E−16 | 2.580042E−17 |
| 0 | 6 | 3.438858E−17 | −8.644946E−17 | 1.793392E−16 |
| 6 | 1 | 3.597953E−22 | 8.223050E−18 | −7.787232E−20 |
| 4 | 3 | −8.477748E−22 | 1.434572E−19 | −1.015673E−19 |
| 2 | 5 | −7.968755E−21 | −3.440227E−20 | −3.353833E−20 |
| 0 | 7 | 4.127765E−20 | 8.308287E−20 | 1.968964E−19 |
| 8 | 0 | −2.158212E−24 | 6.003403E−21 | 1.743900E−23 |
| 6 | 2 | −8.900650E−24 | 1.973750E−20 | 1.587572E−22 |
| 4 | 4 | −1.578193E−23 | 1.031379E−20 | 9.337788E−23 |
| 2 | 6 | −2.526798E−22 | 1.015151E−20 | −1.282198E−22 |
| 0 | 8 | −3.918287E−22 | 3.343627E−21 | −1.212052E−21 |
| 8 | 1 | −2.060555E−26 | 8.146386E−23 | −8.575044E−26 |
| 6 | 3 | −3.616266E−26 | 4.780614E−23 | −3.065432E−25 |
| 4 | 5 | 6.793562E−26 | −2.320583E−23 | −2.247170E−25 |
| 2 | 7 | 2.590357E−25 | −5.718527E−23 | 1.392813E−24 |
| 0 | 9 | −1.970770E−24 | 7.041532E−24 | 1.039128E−23 |
| 10 | 0 | 3.257860E−29 | 2.810782E−25 | 2.125363E−29 |
| 8 | 2 | 2.530387E−28 | −7.859377E−25 | 2.421136E−28 |
| 6 | 4 | 1.114540E−28 | −1.774488E−24 | 6.643227E−28 |
| 4 | 6 | 1.073432E−27 | −8.666873E−25 | 4.504809E−28 |
| 2 | 8 | 1.318014E−26 | −7.659438E−25 | 9.778681E−27 |
| 0 | 10 | 2.466246E−26 | −6.118991E−25 | 1.224805E−25 |
| 10 | 1 | 2.270310E−31 | −2.057030E−27 | −1.620563E−31 |
| 8 | 3 | 7.598035E−31 | −4.522324E−27 | −1.630738E−31 |
| 6 | 5 | −4.584788E−31 | −6.696962E−28 | 8.764038E−31 |
| 4 | 7 | −2.525518E−30 | 1.981460E−27 | 7.477529E−30 |
| 2 | 9 | −1.130567E−29 | 3.324531E−27 | −2.954284E−29 |
| 0 | 11 | 9.526245E−29 | −1.948070E−28 | 3.696116E−28 |
| 12 | 0 | −2.398819E−34 | −1.214991E−29 | 5.204936E−35 |
| 10 | 2 | −3.278943E−33 | 3.601632E−29 | 6.090520E−34 |
| 8 | 4 | −3.359989E−33 | 1.056090E−28 | −5.849937E−34 |
| 6 | 6 | 7.459062E−33 | 6.953210E−29 | −9.296601E−33 |
| 4 | 8 | −2.393674E−32 | 4.126623E−30 | 1.562250E−33 |
| 2 | 10 | −2.814475E−31 | 6.842388E−30 | −1.252686E−31 |
| 0 | 12 | −2.365926E−31 | 1.524177E−29 | −1.176128E−31 |
| 12 | 1 | −9.137131E−37 | 4.713512E−32 | −2.341365E−37 |
| 10 | 3 | −4.404076E−36 | 1.300701E−31 | −3.213915E−36 |
| 8 | 5 | −2.126795E−36 | 6.942879E−32 | −9.805395E−36 |
| 6 | 7 | 1.568458E−35 | −4.002811E−32 | −2.396006E−35 |
| 4 | 9 | 2.576407E−35 | −8.270918E−32 | −7.080660E−35 |
| 2 | 11 | 1.418555E−34 | −7.946193E−32 | 4.646263E−34 |
| 0 | 13 | −9.601065E−34 | −4.317008E−33 | −5.177220E−33 |
| 14 | 0 | 6.345567E−40 | 2.249690E−34 | −3.712312E−41 |
| 12 | 2 | 1.511836E−38 | −5.321257E−34 | 9.079119E−40 |
| 10 | 4 | 2.676097E−38 | −2.148453E−33 | 8.769985E−39 |
| 8 | 6 | −2.062877E−38 | −2.483086E−33 | 4.403764E−38 |
| 6 | 8 | −1.513271E−37 | −5.499215E−34 | 1.438414E−37 |
| 4 | 10 | 1.884868E−37 | 5.306734E−34 | −7.225219E−37 |
| 2 | 12 | 2.289516E−36 | 2.201132E−34 | −3.897378E−37 |
| 0 | 14 | −6.034072E−38 | −9.243085E−35 | −1.503839E−35 |
| Thickness (z distance from the preceding surface) | | 1681.559286 | −1281.74682 | 1370.650142 |
| y distance from the object field center | | −246.435154 | −483.798707 | −632.413744 |
| Tilting with respect to the object plane | | −1.077084 | −2.151688 | −2.435066 |

|   |   | M4 | M5 | M6 |
|---|---|---|---|---|
|   |   |   | Radius |   |
|   |   | 2742.562772 | −6460.545033 | −2388.063697 |
|   |   |   | conical constant |   |
| m | n | 0.000001 | 0 | 0 |
| 2 | 0 | −1.995646E−04 | 9.715039E−05 | 3.290376E−06 |
| 0 | 2 | −1.583595E−08 | −1.146491E−07 | 1.032672E−07 |
| 2 | 1 | 2.140481E−07 | −4.331608E−08 | −2.511001E−09 |
| 0 | 3 | 1.544779E−07 | −5.993206E−08 | −1.576147E−08 |
| 4 | 0 | −6.744624E−12 | 1.662762E−11 | −3.243100E−12 |
| 2 | 2 | 1.341065E−10 | −1.351266E−11 | −1.264917E−11 |
| 0 | 4 | −1.637258E−11 | −7.564481E−11 | −3.801751E−11 |
| 4 | 1 | 2.820052E−14 | −1.423297E−14 | −1.159264E−15 |
| 2 | 3 | 1.107127E−13 | −8.326562E−14 | −2.399137E−14 |
| 0 | 5 | 3.398922E−13 | −9.655053E−14 | −9.760976E−14 |
| 6 | 0 | 3.208683E−18 | 4.754097E−18 | −2.911859E−18 |
| 4 | 2 | 1.545096E−16 | −4.781026E−17 | −4.899941E−18 |
| 2 | 4 | 2.564807E−16 | −1.945729E−16 | −4.460943E−17 |
| 0 | 6 | −2.772012E−15 | −2.178435E−16 | −2.191150E−16 |
| 6 | 1 | −8.853358E−21 | −5.342458E−21 | −8.495540E−21 |
| 4 | 3 | −2.587192E−19 | −1.512317E−19 | 9.764803E−21 |
| 2 | 5 | −5.322595E−18 | −6.266054E−19 | −7.412939E−20 |
| 0 | 7 | −2.730652E−18 | −1.128368E−18 | −1.835851E−19 |
| 8 | 0 | −3.144768E−23 | 2.380815E−23 | −2.176312E−23 |
| 6 | 2 | −1.595782E−22 | −1.905603E−22 | −2.156428E−23 |
| 4 | 4 | −3.410614E−21 | −1.254963E−21 | 2.465192E−22 |
| 2 | 6 | 5.654867E−22 | −3.123694E−21 | 8.048673E−22 |
| 0 | 8 | 1.708848E−20 | −1.245809E−22 | −2.612370E−22 |
| 8 | 1 | 1.588911E−25 | −1.597070E−25 | 7.156647E−26 |
| 6 | 3 | −1.088733E−24 | −3.707343E−25 | −4.151404E−25 |
| 4 | 5 | −8.435209E−24 | 1.829501E−25 | −2.731159E−24 |

-continued

| | | | | |
|---|---|---|---|---|
| 2 | 7 | −1.636180E−22 | 2.416073E−24 | −3.106564E−24 |
| 0 | 9 | −1.986233E−21 | 7.053502E−24 | −1.851092E−23 |
| 10 | 0 | 1.420376E−28 | −1.691811E−28 | 3.840485E−28 |
| 8 | 2 | −3.304161E−28 | 7.649645E−28 | 1.328537E−27 |
| 6 | 4 | −9.994644E−27 | 5.984890E−27 | −1.098241E−28 |
| 4 | 6 | −2.910366E−25 | 2.841490E−26 | −2.627083E−26 |
| 2 | 8 | −6.135492E−24 | 3.026253E−26 | −6.295280E−26 |
| 0 | 10 | −9.061634E−24 | 1.097859E−26 | −8.256725E−26 |
| 10 | 1 | −1.061937E−30 | 4.016183E−31 | −6.560460E−31 |
| 8 | 3 | −6.330513E−30 | −1.126837E−30 | 4.493388E−30 |
| 6 | 5 | −1.311918E−28 | −1.034106E−29 | 3.732127E−29 |
| 4 | 7 | −5.888738E−27 | −1.209326E−28 | 1.218412E−28 |
| 2 | 9 | −2.167258E−27 | −2.237385E−28 | 1.322745E−28 |
| 0 | 11 | 6.165269E−26 | −6.102741E−28 | 7.902176E−28 |
| 12 | 0 | −5.090624E−34 | 8.685756E−34 | −3.378989E−33 |
| 10 | 2 | −5.246345E−33 | −9.743468E−33 | −1.480537E−32 |
| 8 | 4 | −7.999178E−32 | −5.523823E−32 | −4.099169E−32 |
| 6 | 6 | −4.091452E−30 | −4.869357E−31 | 2.718419E−31 |
| 4 | 8 | 7.121343E−30 | −1.145059E−30 | 1.239121E−30 |
| 2 | 10 | 2.211444E−28 | −1.189543E−30 | 1.747696E−30 |
| 0 | 12 | 3.577847E−28 | −2.671284E−31 | 1.261348E−30 |
| 12 | 1 | 1.697182E−36 | −9.644333E−37 | 2.574546E−36 |
| 10 | 3 | −3.004825E−35 | 1.538394E−36 | −2.061930E−35 |
| 8 | 5 | −2.348145E−33 | −9.734647E−35 | −9.600310E−35 |
| 6 | 7 | 6.044909E−34 | 2.448516E−34 | −1.006266E−33 |
| 4 | 9 | 8.874834E−32 | 1.240459E−33 | −1.623314E−33 |
| 2 | 11 | −1.282468E−31 | 1.409514E−33 | −2.124833E−33 |
| 0 | 13 | −9.875435E−31 | 9.674186E−33 | −1.451787E−32 |
| 14 | 0 | 7.360008E−40 | −2.144207E−39 | 1.189237E−38 |
| 12 | 2 | 1.094625E−38 | 4.529315E−38 | 4.351859E−38 |
| 10 | 4 | −5.314061E−37 | 1.333257E−37 | 3.358975E−37 |
| 8 | 6 | −2.437232E−36 | 1.903534E−36 | −9.540309E−37 |
| 6 | 8 | 3.230058E−35 | 6.785742E−36 | −5.976233E−36 |
| 4 | 10 | −4.341459E−34 | 1.045198E−35 | −1.745640E−35 |
| 2 | 12 | −4.842169E−33 | 9.547150E−36 | −1.681874E−35 |
| 0 | 14 | −7.787575E−33 | −1.606013E−35 | 1.261646E−36 |
| Thickness (z distance from the preceding surface) | | −1420.247299 | 1599.623343 | −1482.230253 |
| y distance from the object field center | | −909.982093 | −1004.318125 | −1371.191936 |
| Tilting with respect to the object plane | | −3.841837 | −5.263644 | 0.013583 |

| | | M7 | M8 | |
|---|---|---|---|---|
| | | Radius | | |
| | | 604.459307 | −651.782473 | |
| | | conical constant | | |
| m | n | −0.000001 | 0 | Image plane |
| 2 | 0 | −5.305553E−04 | 6.540129E−05 | |
| 0 | 2 | 4.048672E−09 | −1.841211E−09 | |
| 2 | 1 | −1.025210E−06 | 1.516818E−08 | |
| 0 | 3 | 2.321303E−06 | −7.311920E−08 | |
| 4 | 0 | −3.233309E−11 | 6.909173E−11 | |
| 2 | 2 | 7.671287E−10 | 6.770168E−12 | |
| 0 | 4 | 6.831816E−09 | 2.123200E−11 | |
| 4 | 1 | −4.960281E−12 | 3.575756E−14 | |
| 2 | 3 | 2.688301E−12 | −9.769255E−14 | |
| 0 | 5 | 2.388630E−11 | −1.744858E−13 | |
| 6 | 0 | 1.079945E−15 | 9.381918E−17 | |
| 4 | 2 | 8.039020E−15 | 3.025751E−17 | |
| 2 | 4 | 3.135070E−14 | −5.623930E−17 | |
| 0 | 6 | 1.072397E−13 | 2.346161E−17 | |
| 6 | 1 | −2.656929E−17 | 5.495736E−20 | |
| 4 | 3 | −2.097562E−17 | −1.178691E−19 | |
| 2 | 5 | 1.453410E−16 | −5.210449E−19 | |
| 0 | 7 | 6.060908E−16 | −3.544791E−19 | |
| 8 | 0 | 6.462752E−21 | 1.938350E−22 | |

-continued

| | | | | |
|---|---|---|---|---|
| 6 | 2 | 6.337702E−20 | 7.844922E−23 | |
| 4 | 4 | 1.628899E−19 | −3.019057E−22 | |
| 2 | 6 | 7.462386E−19 | −2.845790E−22 | |
| 0 | 8 | 4.858592E−18 | −7.013363E−23 | |
| 8 | 1 | −1.458292E−22 | 3.050572E−25 | |
| 6 | 3 | −4.855933E−22 | −1.006726E−25 | |
| 4 | 5 | 2.520911E−22 | −1.378994E−24 | |
| 2 | 7 | 7.316826E−22 | −1.992651E−24 | |
| 0 | 9 | 3.485923E−20 | −6.210769E−25 | |
| 10 | 0 | −4.087161E−26 | 2.227285E−28 | |
| 8 | 2 | 1.491561E−24 | 3.274771E−28 | |
| 6 | 4 | 4.671028E−24 | −1.420338E−27 | |
| 4 | 6 | 1.723476E−23 | −2.359880E−27 | |
| 2 | 8 | 4.198778E−23 | −1.663809E−27 | |
| 0 | 10 | 2.007244E−22 | −7.750512E−28 | |
| 10 | 1 | −2.560822E−27 | −5.897761E−31 | |
| 8 | 3 | −6.526619E−27 | 4.597771E−31 | |
| 6 | 5 | −2.330258E−27 | −9.356465E−31 | |
| 4 | 7 | 6.403293E−26 | −3.165683E−30 | |
| 2 | 9 | 8.460530E−25 | −1.900466E−30 | |
| 0 | 11 | 1.116863E−24 | −7.429745E−31 | |
| 12 | 0 | −1.675387E−30 | 4.085376E−34 | |
| 10 | 2 | −2.428015E−29 | 1.433489E−33 | |
| 8 | 4 | −1.416751E−28 | 4.083298E−33 | |
| 6 | 6 | −2.687394E−28 | −1.761690E−33 | |
| 4 | 8 | −1.046240E−27 | −4.623855E−33 | |
| 2 | 10 | 6.072556E−27 | −1.090113E−33 | |
| 0 | 12 | 5.871506E−27 | 1.527723E−33 | |
| 12 | 1 | 1.012895E−32 | 4.733108E−36 | |
| 10 | 3 | −6.287423E−32 | 5.121403E−36 | |
| 8 | 5 | −3.088422E−31 | −1.087030E−35 | |
| 6 | 7 | 2.679647E−31 | −4.899732E−35 | |
| 4 | 9 | −9.004797E−30 | −6.240736E−35 | |
| 2 | 11 | 1.849638E−29 | −3.439730E−35 | |
| 0 | 13 | 2.038632E−29 | −5.620443E−36 | |
| 14 | 0 | 4.712946E−35 | 4.121895E−39 | |
| 12 | 2 | 5.083565E−34 | 4.742796E−39 | |
| 10 | 4 | 3.135037E−33 | −3.595535E−38 | |
| 8 | 6 | 6.065480E−33 | −8.817221E−38 | |
| 6 | 8 | 1.369710E−32 | −1.111832E−37 | |
| 4 | 10 | −1.683155E−32 | −8.723742E−38 | |
| 2 | 12 | 1.953070E−32 | −4.459390E−38 | |
| 0 | 14 | 3.082212E−32 | −1.482044E−38 | |
| Thickness (z distance from the preceding surface) | | 1665.589504 | −511.735529 | 578.462496 |
| y distance from the object field center | | −1784.286575 | −1658.216374 | 0.000000 |
| Tilting with respect to the object plane | | 13.884862 | 6.919762 | 0.000000 |

The distance A between the object-side intermediate plane 19 and the image-side intermediate plane 21 is once again approximately 50% of the field distance FA in the case of the imaging optical unit 25 according to FIG. 3. The distance B between the object plane 5 and the object-side intermediate plane 19 is once again approximately 20% of the field distance FA. The distance C between the image-side intermediate plane 21 and the image field 8 is approximately 30% of the field distance FA in the case of the imaging optical unit 25.

The image field 8 has an extent (x by y) of 26 mm×3 mm in the case of the imaging optical unit 25.

A further embodiment of an imaging optical unit 26 is described below with reference to FIG. 4. The imaging optical unit 26 can be used instead of the imaging optical unit 7. Components corresponding to those which have already been explained above with reference to the imaging optical unit 7 according to FIGS. 1 to 3 bear the same reference numerals and will not be discussed in detail again. FIG. 4 illustrates like FIG. 3 the beam path of in each case three individual rays 15 of the imaging light 3 proceeding from two object field points spaced apart from one another in the y-direction in FIG. 4.

The imaging optical unit 26 has a reduction scale of 8×. An image-field-side numerical aperture of the imaging optical unit 26 is 0.6. The image field 8 has an extent of 26 mm in the x-direction, that is to say perpendicular to the plane of the drawing in FIG. 4, and an extent of 2 mm in the y-direction. The image field 8 rectangular. The chief ray 16 of a central field point of the object field 4 has, proceeding from the object field 4, a chief ray angle with respect to the z-axis of 6°.

The field distance FA of the imaging optical unit 26 which equals its track length is 2,052 mm.

The imaging optical unit 26 has an aperture stop on the mirror M3. The maximum angle of incidence on mirror M7 is 21°. The maximum angle of incidence with respect to the angles M1 to M6 is 19.6° on mirror M6. The angles of incidence on all other mirrors M1 to M5 and also on mirror M8 are smaller than 11.5°. The maximum angle of incidence on the mirror M8 is 8.51°.

The following table reproduces the optical design data with regard to the imaging optical unit 26. In terms of structure, this table corresponds in accordance with the structure of the table explained above with regard to the imaging optical unit 7.

In case of the imaging optical unit 26, the free-form surface of the mirrors M1 to M8 can be described mathematically by the following equation:

$$Z = \frac{c_x x^2 + c_y y^2}{1 + \sqrt{1 - (1+k_x)(c_x x)^2 - (1+k_y)(c_y y)^2}} + \sum_{j=2}^{N} C_j x^m y^n$$

Wherein again the following holds true:

$$j = \frac{(m+n)^2 + m + 3n}{2} + 1$$

Further, the following holds true:

$r_x = 1/c_x$ and $r_y = 1/c_y$ $c_y$ and $c_x$ are the meridional and sagital vertex curvatures of a corresponding asphere. $k_y$ and $k_x$ are the respective conical constants.

|   |   | M1 | M2 | M3 |
|---|---|---|---|---|
|   |   | $r_x$ | | |
|   |   | −2923.427979 | 6203.305434 | −6360.054725 |
|   |   | $r_y$ | | |
|   |   | −2923.427979 | 6203.305434 | −6360.054725 |
|   |   | $k_x$ | | |
|   |   | 0.000000 | 0.000000 | 0.000000 |
|   |   | $k_y$ | | |
| m | n | 0.000000 | 0.000000 | 0.000000 |
| 2 | 0 | −7.260577E−05 | 1.047967E−03 | −7.380602E−05 |
| 0 | 2 | −1.721453E−06 | 2.414461E−05 | −1.763827E−05 |
| 2 | 1 | 1.758368E−09 | −3.337199E−08 | −5.698984E−08 |
| 0 | 3 | −7.868558E−09 | −3.581148E−08 | 9.671458E−08 |
| 4 | 0 | −1.178786E−11 | 2.855106E−09 | 3.102821E−11 |
| 2 | 2 | −1.507003E−11 | 4.153651E−10 | 2.743127E−11 |
| 0 | 4 | 4.331760E−11 | −6.034715E−10 | 4.505939E−10 |
| 4 | 1 | 4.933349E−16 | −1.082648E−12 | −3.322582E−14 |
| 2 | 3 | −1.961991E−15 | 4.603886E−15 | 2.818839E−14 |
| 0 | 5 | 9.998258E−15 | −4.074273E−13 | 9.283434E−13 |
| 6 | 0 | −2.059184E−18 | 1.743228E−14 | 4.198796E−17 |
| 4 | 2 | −4.308725E−18 | 2.837334E−15 | 1.538262E−17 |
| 2 | 4 | −3.206133E−19 | −1.641405E−15 | 2.142032E−16 |
| 0 | 6 | 2.110789E−16 | −2.125101E−15 | 4.026717E−15 |
| 6 | 1 | 1.361554E−22 | −1.586025E−17 | −4.959128E−20 |
| 4 | 3 | −1.010888E−21 | 1.407179E−18 | −5.499324E−21 |
| 2 | 5 | −2.289144E−20 | −5.885615E−19 | 5.220627E−19 |
| 0 | 7 | −8.983778E−19 | 1.684729E−17 | 6.679373E−18 |
| 8 | 0 | −4.767557E−25 | 1.477167E−19 | 2.617646E−23 |
| 6 | 2 | 4.884329E−25 | 8.448712E−20 | 5.433200E−22 |
| 4 | 4 | 4.784699E−24 | −5.551222E−20 | −4.820634E−22 |
| 2 | 6 | 1.805458E−22 | −7.948409E−20 | −2.766057E−21 |
| 0 | 8 | 9.288258E−21 | −1.505394E−19 | 5.249886E−20 |
| 8 | 1 | −1.007432E−28 | 1.027232E−22 | −1.004708E−25 |
| 6 | 3 | 3.268255E−27 | 1.538613E−22 | −9.580436E−26 |
| 4 | 5 | 4.352883E−26 | −5.800911E−23 | 3.601421E−24 |
| 2 | 7 | 4.157239E−25 | 1.311532E−22 | 1.404213E−23 |
| 0 | 9 | 1.098118E−23 | 1.264545E−23 | 2.123072E−22 |
| 10 | 0 | 4.554201E−31 | −1.277622E−24 | −4.853892E−28 |
| 8 | 2 | −1.160774E−29 | −5.792286E−24 | −6.641091E−27 |
| 6 | 4 | −3.304935E−29 | −3.281641E−24 | −7.730152E−27 |
| 4 | 6 | −2.538443E−28 | 5.818340E−24 | 1.007360E−25 |
| 2 | 8 | −6.444814E−27 | 5.197378E−24 | 2.569124E−25 |
| 0 | 10 | −2.677530E−25 | 9.864077E−24 | 7.350193E−25 |
| 10 | 1 | 3.812489E−34 | −1.729076E−26 | −4.782394E−31 |
| 8 | 3 | −1.391213E−32 | 3.561012E−27 | −2.629131E−30 |
| 6 | 5 | 1.532933E−32 | −1.294071E−26 | −2.113889E−29 |
| 4 | 7 | −1.372744E−30 | 7.360449E−27 | −8.162931E−29 |
| 2 | 9 | −4.547265E−30 | −2.202198E−27 | −2.914744E−28 |
| 0 | 11 | 1.512895E−28 | −9.666268E−27 | −1.397120E−27 |
| 12 | 0 | −1.179837E−36 | 2.109393E−28 | 1.718276E−33 |
| 10 | 2 | 2.558377E−35 | 1.625109E−28 | 3.079874E−32 |
| 8 | 4 | 1.732311E−34 | −6.811372E−29 | 9.766315E−32 |
| 6 | 6 | −3.204740E−35 | −2.649489E−29 | −4.455972E−31 |
| 4 | 8 | 6.550804E−33 | −2.160480E−28 | −2.695243E−30 |
| 2 | 10 | 8.257229E−32 | −1.219536E−28 | −4.696162E−30 |
| 0 | 12 | 1.555632E−30 | −1.374800E−28 | −1.312011E−29 |
| Thickness (z distance from the preceding surface) | | 1800.739168 | −1503.371882 | 1498.971567 |
| y distance from the object field center | | −205.945210 | −460.946527 | −655.176383 |
| Tilting with respect to the object plane | | −1.729705 | −1.203277 | −2.066474 |

|   |   | M4 | M5 | M6 |
|---|---|---|---|---|
|   |   | $r_x$ | | |
|   |   | 155994.46564 | −5950.624677 | −3600.730685 |
|   |   | $r_y$ | | |
|   |   | 2192.831980 | −5950.624677 | −3600.730685 |
|   |   | $k_x$ | | |
|   |   | 0.000000 | 0.000000 | 0.000000 |
|   |   | $k_y$ | | |
| m | n | 0.000000 | 0.000000 | 0.000000 |
| 2 | 0 | −1.007298E−07 | 4.775267E−05 | −4.181667E−05 |
| 0 | 2 | 3.562850E−09 | −5.195334E−05 | −2.128817E−05 |
| 2 | 1 | −1.796349E−07 | 2.510276E−08 | −2.495383E−09 |
| 0 | 3 | −6.080826E−07 | 4.471937E−09 | 9.362216E−09 |

-continued

| | | | | |
|---|---|---|---|---|
| 4 | 0 | −2.348623E−11 | 9.472235E−12 | −1.146336E−12 |
| 2 | 2 | −1.822298E−10 | 1.003443E−11 | 2.011804E−12 |
| 0 | 4 | 2.085705E−09 | 1.227366E−11 | −3.775065E−12 |
| 4 | 1 | 1.020559E−13 | 5.034141E−15 | −3.107332E−15 |
| 2 | 3 | 3.685321E−13 | 4.707516E−14 | −2.948454E−14 |
| 0 | 5 | −4.387552E−12 | 4.173035E−15 | −5.426497E−15 |
| 6 | 0 | 1.529635E−17 | −3.649720E−18 | 1.799519E−18 |
| 4 | 2 | −1.850512E−16 | −2.081522E−18 | 1.225064E−17 |
| 2 | 4 | −1.839755E−15 | 2.541548E−18 | 5.239177E−18 |
| 0 | 6 | 3.913614E−14 | 1.110951E−17 | −1.335694E−17 |
| 6 | 1 | −1.664885E−19 | −1.155032E−20 | 1.993223E−20 |
| 4 | 3 | 1.910900E−18 | −1.735910E−20 | 4.186193E−20 |
| 2 | 5 | 1.998066E−18 | −2.557366E−20 | 1.631376E−19 |
| 0 | 7 | 1.023730E−16 | −1.577746E−20 | 2.387626E−19 |
| 8 | 0 | −4.140499E−23 | 6.675094E−24 | −3.838375E−24 |
| 6 | 2 | 3.014981E−22 | 1.216306E−23 | 4.217949E−23 |
| 4 | 4 | −4.520287E−21 | −1.033860E−22 | 3.124418E−23 |
| 2 | 6 | −9.491217E−20 | 1.872766E−23 | 3.864196E−23 |
| 0 | 8 | −1.312246E−18 | −7.663113E−23 | 7.696279E−22 |
| 8 | 1 | 1.086527E−25 | 1.160453E−25 | −1.688300E−25 |
| 6 | 3 | −4.835952E−26 | 9.112740E−26 | −3.383371E−25 |
| 4 | 5 | 2.375312E−27 | 7.969452E−25 | −2.681652E−24 |
| 2 | 7 | 1.498395E−27 | 5.157247E−26 | −2.378171E−24 |
| 0 | 9 | 4.564485E−28 | −4.198834E−25 | −1.407232E−24 |
| 10 | 0 | 1.022024E−28 | −1.481767E−30 | 9.942602E−30 |
| 8 | 2 | 2.029121E−28 | −9.883546E−29 | 4.256514E−28 |
| 6 | 4 | 2.551927E−29 | 2.957371E−28 | −4.015744E−28 |
| 4 | 6 | −2.638803E−31 | 2.966412E−27 | −7.299581E−27 |
| 2 | 8 | 1.077406E−30 | 7.951644E−28 | −2.177114E−27 |
| 0 | 10 | −6.014280E−32 | −4.738996E−27 | −2.377079E−27 |
| 10 | 1 | 0.000000E+00 | −4.626524E−31 | 1.418108E−30 |
| 8 | 3 | 0.000000E+00 | −2.085782E−30 | 8.237678E−30 |
| 6 | 5 | 0.000000E+00 | 1.381133E−30 | 6.889664E−30 |
| 4 | 7 | 0.000000E+00 | 5.966210E−31 | 2.023941E−29 |
| 2 | 9 | 0.000000E+00 | 5.227558E−30 | 8.891613E−30 |
| 0 | 11 | 0.000000E+00 | 7.461373E−30 | −4.656669E−29 |
| 12 | 0 | 0.000000E+00 | −9.292280E−35 | 2.414263E−34 |
| 10 | 2 | 0.000000E+00 | −1.299106E−33 | 5.490782E−33 |
| 8 | 4 | 0.000000E+00 | −2.650668E−33 | 1.586967E−32 |
| 6 | 6 | 0.000000E+00 | 9.176468E−34 | 2.535898E−32 |
| 4 | 8 | 0.000000E+00 | −7.678515E−33 | 8.487881E−32 |
| 2 | 10 | 0.000000E+00 | 5.359564E−33 | 1.264049E−32 |
| 0 | 12 | 0.000000E+00 | 4.219220E−32 | −1.762313E−31 |
| Thickness (z distance from the preceding surface) | | −1455.676056 | 1434.672544 | −1473.234525 |
| y distance from the object field center | | −953.394045 | −1065.294244 | −1430.599424 |
| Tilting with respect to the object plane | | −3.904026 | −5.100115 | −0.284160 |

| | | M7 | M8 |
|---|---|---|---|
| | | $r_x$ | |
| | | 1028.917016 | −646.484196 |
| | | $r_y$ | |
| | | 453.139187 | −612.371333 |
| | | $k_x$ | |
| | | 2.411904 | 0.088265 |
| | | $k_y$ | |
| m | n | 2.411904 | 0.088265 | Image plane |
| 2 | 0 | 0.000000E+00 | 0.000000E+00 | |
| 0 | 2 | 0.000000E+00 | 0.000000E+00 | |
| 2 | 1 | −1.629515E−06 | −3.331733E−08 | |
| 0 | 3 | 5.335590E−07 | −3.291282E−08 | |
| 4 | 0 | 2.219212E−09 | −1.788408E−11 | |
| 2 | 2 | 4.995666E−10 | 1.324469E−11 | |

-continued

| | | | | |
|---|---|---|---|---|
| 0 | 4 | −1.098725E−09 | 9.222142E−12 | |
| 4 | 1 | −1.109603E−11 | 6.443019E−15 | |
| 2 | 3 | −8.658176E−12 | −1.061503E−13 | |
| 0 | 5 | 1.281797E−11 | −7.443484E−14 | |
| 6 | 0 | 1.888555E−14 | −6.373163E−17 | |
| 4 | 2 | 2.652683E−14 | −8.318504E−18 | |
| 2 | 4 | −4.642761E−15 | 2.522532E−17 | |
| 0 | 6 | 3.444740E−15 | 1.516975E−18 | |
| 6 | 1 | −1.461648E−16 | 4.743239E−20 | |
| 4 | 3 | −2.398102E−16 | −5.115452E−20 | |
| 2 | 5 | 4.421359E−17 | −4.283706E−19 | |
| 0 | 7 | −3.585014E−16 | −1.078823E−19 | |
| 8 | 0 | 2.116128E−19 | −1.972876E−22 | |
| 6 | 2 | 1.972750E−19 | −3.275849E−22 | |
| 4 | 4 | 4.859979E−19 | −1.074333E−22 | |
| 2 | 6 | 3.258859E−18 | 1.563814E−22 | |
| 0 | 8 | −3.232246E−18 | 1.963345E−24 | |
| 8 | 1 | −4.289233E−22 | 6.523122E−26 | |
| 6 | 3 | −4.856157E−21 | −2.377025E−26 | |
| 4 | 5 | −8.170632E−21 | −5.269149E−25 | |
| 2 | 7 | 2.198441E−20 | −8.706058E−25 | |
| 0 | 9 | −3.071412E−20 | −1.989653E−25 | |
| 10 | 0 | 2.804296E−24 | 2.374293E−28 | |
| 8 | 2 | 1.804085E−23 | 1.232036E−27 | |
| 6 | 4 | 2.351130E−24 | 1.080022E−27 | |
| 4 | 6 | −7.992179E−23 | −5.956542E−28 | |
| 2 | 8 | −2.245391E−23 | −4.721465E−28 | |
| 0 | 10 | −4.068648E−22 | −1.802399E−28 | |
| 10 | 1 | −5.991881E−26 | 1.521789E−30 | |
| 8 | 3 | −1.549843E−25 | 5.084676E−30 | |
| 6 | 5 | 7.036664E−26 | −3.757680E−31 | |
| 4 | 7 | 5.137253E−25 | −7.813532E−30 | |
| 2 | 9 | 2.465298E−26 | −4.946939E−30 | |
| 0 | 11 | −2.658811E−24 | −1.116232E−30 | |
| 12 | 0 | 3.540958E−29 | −4.247042E−33 | |
| 10 | 2 | −2.274388E−29 | −1.505401E−32 | |
| 8 | 4 | 6.197305E−28 | −2.067195E−32 | |
| 6 | 6 | 3.926021E−27 | −1.039231E−32 | |
| 4 | 8 | 9.541469E−27 | 7.221316E−33 | |
| 2 | 10 | 6.473734E−27 | 6.127995E−33 | |
| 0 | 12 | −4.056868E−27 | 2.049410E−33 | |
| Thickness (z distance from the preceding surface) | | 1632.535363 | −508.021690 | 548.360354 |
| y distance from the object field center | | −1834.484816 | −1721.332503 | −1722.048921 |
| Tilting with respect to the object plane | | 13.416173 | 6.486398 | 0.000000 |

The distance A between the object-side intermediate plane 19 and the image-side intermediate plane 21 is approximately 55% of the field distance FA in the case of the imaging optical unit 26 according to FIG. 4. A distance B between the object plane and the object-side intermediate plane 19 is once again approximately 20% of the field distance FA. The distance C between the image-side intermediate plane 21 and the image field 8 (or the image field reference plane 22) is approximately 25% of the field distance FA in the case of the imaging optical unit 26.

A further embodiment of an imaging optical unit 27 is described below with reference to FIG. 5. The imaging optical unit 27 can be used instead of the imaging optical unit 7. Components corresponding to those which have already been explained above with reference to the imaging optical unit 7 according to FIGS. 1 to 3 and in particular with reference to FIG. 4 bear the same reference numerals and will not be discussed in detail again.

The imaging optical unit 27 has a reduction scale 8×. An image-field-side numerical aperture of the imaging optical unit 27 is 0.65. The image field 8 has an extent (x by y) of 13 mm×2 mm in the case of the imaging optical unit 27. The image field 8 is rectangular. The chief ray 16 of a central field point of the object field 4 has, proceeding from the object field 4 a chief ray angle with respect to the z-axis of 6°.

The field distance FA which corresponds to the track length of the imaging optical unit 27 is 2,250 mm.

The imaging optical unit 27 has an aperture stop on the mirror M3.

A maximum incidence angle of the imaging light 3 on the mirror M7 is 24.3°. With respect to mirrors M1 to M6, the maximum incidence angle of the imaging light on any of the mirrors is 19.4° on mirror M6. The maximum incidence angle on all the other mirrors M1 to M5 including M8 have a maximum incidence angle of 12.1°. The maximum angle of incidence on mirror M8 is 7.8°.

The following table reproduces the optical design data with regard to the imaging optical unit 27. In terms of structure, this table corresponds in accordance with the structure of the table explained above with regard to the imaging optical unit 26.

|   |   | M1 | M2 | M3 |
|---|---|---|---|---|
|   |   | $r_x$ | | |
|   |   | −2259.384014 | 482.639644 | −3506.884223 |
|   |   | $r_y$ | | |
|   |   | −3329.662648 | 6181.672131 | −4943.348840 |
|   |   | $k_x$ | | |
|   |   | 0.000000 | 0.000000 | 0.000000 |
|   |   | $k_y$ | | |
| m | n | 0.000000 | 0.000000 | 0.000000 |
| 2 | 0 | 0.000000E+00 | 0.000000E+00 | 0.000000E+00 |
| 0 | 2 | 0.000000E+00 | 0.000000E+00 | 0.000000E+00 |
| 2 | 1 | 1.803303E−09 | −5.720007E−08 | −5.402553E−08 |
| 0 | 3 | −4.682449E−09 | −1.882320E−08 | 6.468783E−08 |
| 4 | 0 | −2.222611E−12 | 1.711440E−09 | 3.451894E−11 |
| 2 | 2 | −6.929368E−12 | 2.712248E−10 | 5.213577E−11 |
| 0 | 4 | 5.705053E−11 | −6.041908E−10 | 4.127694E−10 |
| 4 | 1 | 4.933624E−16 | −1.302923E−12 | −6.161154E−15 |
| 2 | 3 | −5.997068E−16 | −5.726929E−14 | −3.865701E−14 |
| 0 | 5 | −3.176965E−14 | 9.624197E−14 | 3.445286E−13 |
| 6 | 0 | −4.933083E−19 | 1.657230E−14 | 5.757803E−17 |
| 4 | 2 | −1.642335E−18 | 2.402705E−15 | 1.034513E−18 |
| 2 | 4 | −1.259638E−18 | −1.596451E−15 | 1.429331E−16 |
| 0 | 6 | 2.411379E−16 | −9.305962E−16 | 2.822898E−15 |
| 6 | 1 | −1.906709E−22 | −1.595604E−17 | −1.439103E−20 |
| 4 | 3 | −6.548045E−22 | −5.668903E−18 | 9.596904E−20 |
| 2 | 5 | 6.761539E−21 | −1.884905E−18 | 2.499866E−19 |
| 0 | 7 | 2.336303E−19 | 2.157271E−18 | 2.553485E−18 |
| 8 | 0 | −5.684326E−26 | −1.437626E−19 | −6.657830E−23 |
| 6 | 2 | 1.314152E−24 | 1.630310E−19 | 7.085590E−23 |
| 4 | 4 | 5.879836E−24 | 5.568880E−20 | −1.566586E−22 |
| 2 | 6 | 1.296018E−22 | 1.469262E−20 | 2.172076E−23 |
| 0 | 8 | −1.273584E−21 | 4.104254E−20 | 2.118458E−20 |
| 8 | 1 | 3.519787E−27 | −1.769720E−22 | 5.255308E−26 |
| 6 | 3 | 3.194890E−26 | 5.205563E−22 | −2.012898E−26 |
| 4 | 5 | −2.768066E−26 | 5.938165E−22 | 4.521988E−25 |
| 2 | 7 | −1.164550E−24 | 2.526177E−22 | −1.660081E−24 |
| 0 | 9 | 6.883489E−25 | −1.398684E−22 | 1.307419E−23 |
| 10 | 0 | 1.578216E−30 | 4.006550E−23 | −3.451823E−29 |
| 8 | 2 | −7.096837E−29 | 1.537772E−24 | −1.387950E−28 |
| 6 | 4 | −6.296711E−29 | −1.418716E−23 | 1.350249E−27 |
| 4 | 6 | −1.869280E−28 | −4.660940E−24 | 5.181903E−27 |
| 2 | 8 | −1.693775E−27 | −8.059099E−25 | 1.378250E−26 |
| 0 | 10 | 3.977327E−27 | −6.176645E−26 | 2.254741E−25 |
| 10 | 1 | −2.414858E−32 | 5.290493E−26 | −2.021952E−31 |
| 8 | 3 | −1.732851E−31 | −3.433825E−27 | −4.399105E−31 |
| 6 | 5 | −7.872834E−31 | −3.224730E−26 | −1.173076E−31 |
| 4 | 7 | 3.013978E−30 | −1.713029E−26 | 4.501106E−31 |
| 2 | 9 | 2.389240E−29 | −5.478830E−27 | 9.477341E−29 |
| 0 | 11 | 2.950166E−29 | 1.851993E−27 | 8.617723E−28 |
| 12 | 0 | −1.383837E−35 | −2.053360E−27 | −1.270939E−34 |
| 10 | 2 | 5.249565E−34 | −1.125143E−27 | −3.288614E−35 |
| 8 | 4 | 6.443403E−34 | 7.028586E−28 | −2.980246E−33 |
| 6 | 6 | 2.809820E−33 | 3.829301E−28 | −2.830932E−32 |
| 4 | 8 | −8.195411E−33 | 1.111716E−28 | −5.037741E−32 |
| 2 | 10 | −3.936633E−32 | 2.040998E−29 | −1.497271E−31 |
| 0 | 12 | −1.414080E−31 | −3.890688E−30 | 1.095745E−31 |
| 12 | 1 | 0.000000E+00 | 0.000000E+00 | 0.000000E+00 |
| 10 | 3 | 0.000000E+00 | 0.000000E+00 | 0.000000E+00 |
| 8 | 5 | 0.000000E+00 | 0.000000E+00 | 0.000000E+00 |
| 6 | 7 | 0.000000E+00 | 0.000000E+00 | 0.000000E+00 |
| 4 | 9 | 0.000000E+00 | 0.000000E+00 | 0.000000E+00 |
| 2 | 11 | 0.000000E+00 | 0.000000E+00 | 0.000000E+00 |
| 0 | 13 | 0.000000E+00 | 0.000000E+00 | 0.000000E+00 |
| 14 | 0 | 0.000000E+00 | 0.000000E+00 | 0.000000E+00 |
| 12 | 2 | 0.000000E+00 | 0.000000E+00 | 0.000000E+00 |
| 10 | 4 | 0.000000E+00 | 0.000000E+00 | 0.000000E+00 |
| 8 | 6 | 0.000000E+00 | 0.000000E+00 | 0.000000E+00 |
| 6 | 8 | 0.000000E+00 | 0.000000E+00 | 0.000000E+00 |
| 4 | 10 | 0.000000E+00 | 0.000000E+00 | 0.000000E+00 |
| 2 | 12 | 0.000000E+00 | 0.000000E+00 | 0.000000E+00 |
| 0 | 14 | 0.000000E+00 | 0.000000E+00 | 0.000000E+00 |
| Thickness (z distance from the preceding surface) | | 1966.144293 | −1594.883752 | 1585.214060 |
| y distance from the object field center | | −242.917244 | −499.644194 | −717.165031 |
| Tilting with respect to the object plane | | −1.368566 | −0.769469 | −1.654910 |

|   |   | M4 | M5 | M6 |
|---|---|---|---|---|
|   |   | $r_x$ | | |
|   |   | 98422.52378 | −16853.251889 | −3059.772444 |
|   |   | $r_y$ | | |
|   |   | 2800.080122 | −4154.403568 | −3455.331296 |
|   |   | $k_x$ | | |
|   |   | 0.000000 | 0.000000 | 0.000000 |
|   |   | $k_y$ | | |
| m | n | 0.000000 | 0.000000 | 0.000000 |
| 2 | 0 | 0.000000E+00 | 0.000000E+00 | 0.000000E+00 |
| 0 | 2 | 0.000000E+00 | 0.000000E+00 | 0.000000E+00 |
| 2 | 1 | −1.348224E−07 | 2.537692E−08 | −4.727422E−08 |
| 0 | 3 | −5.504977E−07 | −1.262363E−08 | 2.343543E−08 |
| 4 | 0 | −1.642742E−11 | 5.439449E−12 | 2.065462E−12 |
| 2 | 2 | −8.894347E−11 | 8.307823E−12 | 3.384897E−12 |
| 0 | 4 | 2.302704E−09 | 1.714240E−11 | −5.377759E−12 |
| 4 | 1 | 3.632954E−09 | 3.438602E−15 | −1.274695E−15 |
| 2 | 3 | 3.597220E−13 | 2.522033E−14 | −1.448694E−14 |
| 0 | 5 | 1.990873E−12 | −2.647781E−14 | 1.441431E−15 |
| 6 | 0 | 1.669708E−18 | −1.795440E−19 | 1.095026E−19 |
| 4 | 2 | −2.027613E−17 | 2.265812E−18 | −3.257744E−18 |
| 2 | 4 | −2.564165E−15 | 1.024136E−17 | −3.430479E−17 |
| 0 | 6 | −1.847734E−14 | −1.226371E−17 | −3.904268E−17 |
| 6 | 1 | −7.653798E−20 | −2.075632E−23 | 4.313547E−21 |
| 4 | 3 | 1.512527E−19 | 4.222331E−20 | −5.971735E−20 |
| 2 | 5 | 1.671761E−18 | 3.086337E−20 | 1.317307E−19 |
| 0 | 7 | 1.261647E−16 | 1.271858E−19 | −2.041186E−19 |
| 8 | 0 | 1.081429E−23 | −3.648568E−24 | 7.689607E−25 |
| 6 | 2 | 4.000382E−22 | 1.385395E−23 | 3.298305E−23 |
| 4 | 4 | −5.419165E−23 | −1.931310E−23 | 1.477979E−22 |
| 2 | 6 | −1.138327E−19 | 1.923957E−22 | 1.233323E−21 |
| 0 | 8 | 1.588411E−19 | 2.782842E−22 | −2.282435E−22 |

| | | | | |
|---|---|---|---|---|
| 8 | 1 | 1.466855E−25 | 3.505000E−26 | −8.903625E−26 |
| 6 | 3 | 6.666247E−25 | −8.425179E−26 | 3.152637E−25 |
| 4 | 5 | 1.342311E−23 | 6.969315E−26 | 9.464426E−25 |
| 2 | 7 | 1.952426E−22 | −2.580718E−25 | 2.086490E−24 |
| 0 | 9 | −1.025859E−20 | −2.024554E−25 | 1.931529E−24 |
| 10 | 0 | −1.111398E−29 | 9.651765E−30 | −1.234284E−29 |
| 8 | 2 | −1.118417E−27 | −5.608111E−29 | −3.437796E−28 |
| 6 | 4 | −5.036941E−27 | −7.238930E−29 | 1.089584E−27 |
| 4 | 6 | 3.149304E−25 | 3.370297E−28 | −1.038244E−27 |
| 2 | 8 | 2.770940E−24 | −1.930688E−27 | −1.098501E−26 |
| 0 | 10 | −7.607771E−24 | −5.619876E−28 | 8.898698E−27 |
| 10 | 1 | −2.140390E−31 | −1.074198E−31 | 1.541407E−31 |
| 8 | 3 | −3.444238E−30 | −2.853540E−31 | −9.164365E−31 |
| 6 | 5 | −1.256369E−29 | 8.460772E−31 | 9.091178E−31 |
| 4 | 7 | −8.114948E−28 | 7.945929E−31 | −1.437047E−29 |
| 2 | 9 | 2.576838E−27 | 9.669393E−31 | −5.150028E−29 |
| 0 | 11 | 3.281749E−25 | −2.118401E−30 | 1.774326E−29 |
| 12 | 0 | 3.703921E−35 | −3.117049E−35 | 4.962204E−35 |
| 10 | 2 | 1.596976E−33 | −1.898879E−34 | 3.166204E−34 |
| 8 | 4 | 2.916490E−32 | −1.506567E−34 | −1.276972E−33 |
| 6 | 6 | −3.502281E−31 | 1.330542E−33 | −9.790431E−34 |
| 4 | 8 | −1.090845E−29 | 2.382120E−33 | −2.293736E−32 |
| 2 | 10 | −3.640496E−29 | 1.717476E−33 | −5.832060E−32 |
| 0 | 12 | −6.695984E−28 | −2.699840E−33 | 1.406260E−32 |
| 12 | 1 | 0.000000E+00 | 0.000000E+00 | 0.000000E+00 |
| 10 | 3 | 0.000000E+00 | 0.000000E+00 | 0.000000E+00 |
| 8 | 5 | 0.000000E+00 | 0.000000E+00 | 0.000000E+00 |
| 6 | 7 | 0.000000E+00 | 0.000000E+00 | 0.000000E+00 |
| 4 | 9 | 0.000000E+00 | 0.000000E+00 | 0.000000E+00 |
| 2 | 11 | 0.000000E+00 | 0.000000E+00 | 0.000000E+00 |
| 0 | 13 | 0.000000E+00 | 0.000000E+00 | 0.000000E+00 |
| 14 | 0 | 0.000000E+00 | 0.000000E+00 | 0.000000E+00 |
| 12 | 2 | 0.000000E+00 | 0.000000E+00 | 0.000000E+00 |
| 10 | 4 | 0.000000E+00 | 0.000000E+00 | 0.000000E+00 |
| 8 | 6 | 0.000000E+00 | 0.000000E+00 | 0.000000E+00 |
| 6 | 8 | 0.000000E+00 | 0.000000E+00 | 0.000000E+00 |
| 4 | 10 | 0.000000E+00 | 0.000000E+00 | 0.000000E+00 |
| 2 | 12 | 0.000000E+00 | 0.000000E+00 | 0.000000E+00 |
| 0 | 14 | 0.000000E+00 | 0.000000E+00 | 0.000000E+00 |
| Thickness (z distance from the preceding surface) | | −1566.833059 | 1551.079338 | −1594.386387 |
| y distance from the object field center | | −1027.591658 | −1151.299934 | −1546.376066 |
| Tilting with respect to the object plane | | −3.659955 | −5.094533 | −0.248681 |

| | | M7 | M8 | |
|---|---|---|---|---|
| | | $r_x$ | | |
| | | 1039.503321 | −669.071565 | |
| | | $r_y$ | | |
| | | 374.365187 | −668.995800 | |
| | | $k_x$ | | |
| | | 1.624215 | 0.040125 | |
| | | $k_y$ | | |
| m | n | 1.624215 | 0.040124 | Image plane |
| 2 | 0 | 0.000000E+00 | 3.522830E−05 | |
| 0 | 2 | 0.000000E+00 | −6.357789E−06 | |
| 2 | 1 | −1.650869E−06 | −3.032029E−08 | |
| 0 | 3 | 1.635570E−06 | −3.341613E−08 | |
| 4 | 0 | 1.829149E−09 | 1.895120E−11 | |
| 2 | 2 | −1.191556E−09 | 8.389707E−12 | |
| 0 | 4 | 2.758844E−09 | −2.638659E−11 | |
| 4 | 1 | −1.051502E−11 | −2.295136E−14 | |
| 2 | 3 | −1.987477E−11 | −1.124747E−13 | |
| 0 | 5 | 3.677570E−11 | −5.482660E−14 | |

| | | | | |
|---|---|---|---|---|
| 6 | 0 | 1.438167E−14 | −5.011986E−18 | |
| 4 | 2 | 1.896835E−14 | 2.287750E−17 | |
| 2 | 4 | −7.046795E−14 | −7.202649E−17 | |
| 0 | 6 | 5.971699E−14 | −6.068709E−17 | |
| 6 | 1 | −1.326604E−16 | −6.210014E−20 | |
| 4 | 3 | −2.497668E−16 | −1.842022E−19 | |
| 2 | 5 | −3.833701E−16 | −2.940972E−19 | |
| 0 | 7 | −3.180916E−16 | −9.677233E−20 | |
| 8 | 0 | 2.308475E−19 | 7.049729E−23 | |
| 6 | 2 | −9.013855E−21 | 2.731743E−24 | |
| 4 | 4 | −1.364381E−18 | −8.986586E−23 | |
| 2 | 6 | −3.448164E−18 | −2.231835E−22 | |
| 0 | 8 | −6.561787E−18 | −1.836607E−22 | |
| 8 | 1 | −4.478499E−22 | 8.205840E−26 | |
| 6 | 3 | −1.170128E−20 | −1.944611E−25 | |
| 4 | 5 | −2.454342E−20 | −6.434117E−25 | |
| 2 | 7 | −2.607881E−20 | −9.443855E−25 | |
| 0 | 9 | −8.289368E−20 | −2.268234E−25 | |
| 10 | 0 | −4.128323E−25 | 1.076210E−28 | |
| 8 | 2 | −1.910186E−24 | 4.533525E−28 | |
| 6 | 4 | −4.485030E−23 | 2.704781E−29 | |
| 4 | 6 | 3.538897E−23 | −1.191444E−27 | |
| 2 | 8 | −1.475876E−23 | −1.400736E−27 | |
| 0 | 10 | −9.208498E−22 | −3.759044E−28 | |
| 10 | 1 | −2.184089E−26 | −1.965457E−33 | |
| 8 | 3 | 8.070238E−26 | −7.411870E−31 | |
| 6 | 5 | 4.294272E−25 | −1.979897E−30 | |
| 4 | 7 | 1.767599E−24 | −2.219238E−30 | |
| 2 | 9 | 8.098640E−25 | −7.715238E−31 | |
| 0 | 11 | −5.544688E−24 | −4.413878E−31 | |
| 12 | 0 | 5.065280E−29 | 7.252775E−35 | |
| 10 | 2 | 5.948897E−28 | −1.233170E−34 | |
| 8 | 4 | 2.513311E−27 | −8.137242E−34 | |
| 6 | 6 | 4.926542E−27 | −2.679778E−33 | |
| 4 | 8 | 8.065325E−27 | −1.902450E−33 | |
| 2 | 10 | 3.261556E−27 | −1.404087E−33 | |
| 0 | 12 | −1.358292E−26 | −6.436589E−35 | |
| 12 | 1 | 0.000000E+00 | 8.959631E−37 | |
| 10 | 3 | 0.000000E+00 | 3.736414E−36 | |
| 8 | 5 | 0.000000E+00 | −8.329546E−37 | |
| 6 | 7 | 0.000000E+00 | −1.631735E−35 | |
| 4 | 9 | 0.000000E+00 | −1.962959E−35 | |
| 2 | 11 | 0.000000E+00 | −1.002559E−35 | |
| 0 | 13 | 0.000000E+00 | −1.845484E−36 | |
| 14 | 0 | 0.000000E+00 | 4.004444E−40 | |
| 12 | 2 | 0.000000E+00 | 4.076970E−39 | |
| 10 | 4 | 0.000000E+00 | 9.693556E−39 | |
| 8 | 6 | 0.000000E+00 | −2.311293E−39 | |
| 6 | 8 | 0.000000E+00 | −2.489153E−38 | |
| 4 | 10 | 0.000000E+00 | −3.055127E−38 | |
| 2 | 12 | 0.000000E+00 | −1.532923E−38 | |
| 0 | 14 | 0.000000E+00 | −3.098356E−39 | |
| Thickness (z distance from the preceding surface) | | 1770.068215 | −554.752631 | 610.914332 |
| y distance from the object field center | | −1986.184450 | −1862.349419 | −1862.810703 |
| Tilting with respect to the object plane | | 13.478021 | 6.545096 | 0.000000 |

The distance A between the object-side intermediate plane 19 and the image-side intermediate plane 21 is approximately 54% of the field distance FA in the case of the imaging optical unit 27 according to FIG. 5. The distance B between the object plane 5 and the object-side intermediate plane 19 is approximately 18% of the field distance FA. The distance C between the image-side intermediate plane 21 and the image field 8 (or the image field reference plane 22) is approximately 28% of the field distance FA in the case of the imaging optical unit 27.

A further embodiment of an imaging optical unit 28 is described below with reference to FIG. 6. The imaging optical unit 28 can be used instead of the imaging optical unit 7. Components corresponding to those which have already been explained above with reference to the imaging optical unit 7 according to FIGS. 1 to 3 and in particular with reference to imaging optical unit 26 and 27 with reference to FIGS. 4 and 5 bear the same reference numerals and will not be discussed in detail again.

The imaging optical unit 28 has a reduction scale of 8×. An image-field-side numerical aperture of the imaging optical unit 26 is 0.7. The image field 8 has an extent (x by y) of 13 mm×1.25 mm in the case of the imaging optical unit 28. The image field 8 is rectangular. The chief ray 16 of a central field point of the object field 4 has, proceeding from the object field 4 a chief ray angle with respect to the z-axis of 6°.

The field distance FA which equals the track length of the imaging optical unit 28 is 2,334 mm.

The imaging optical unit 28 has an aperture stop on the mirror M3.

The maximum angle of incidence of the imaging light 3 of 30.3° is present on mirror M7. The maximum angle of incidence with respect to mirrors M1 to M6 is 20.5° on mirror M6. The maximum angle of incidence on all other mirrors M1 to M5 and M8 is 14.7°. The maximum angle of incidence on mirror M8 is 6.9°.

The following table reproduces the optical design data with regard to the imaging optical unit 28. In terms of structure, this table corresponds in accordance with the structure of the table explained above with regard to the imaging optical unit 26.

|   |   | M1 | M2 | M3 |
|---|---|---|---|---|
|   |   | $r_x$ | | |
|   |   | −2209.057086 | 455.690094 | −4036.280814 |
|   |   | $r_y$ | | |
|   |   | −4061.443505 | 6864.696815 | −4411.636969 |
|   |   | $k_x$ | | |
|   |   | 0.000000 | 0.000000 | 0.000000 |
|   |   | $k_y$ | | |
| m | n | 0.000000 | 0.000000 | 0.000000 |
| 2 | 0 | 0.000000E+00 | 0.000000E+00 | 0.000000E+00 |
| 0 | 2 | 0.000000E+00 | 0.000000E+00 | 0.000000E+00 |
| 2 | 1 | −2.562195E−09 | −1.338682E−07 | −5.036929E−08 |
| 0 | 3 | 8.799022E−08 | −4.690514E−08 | 7.881329E−08 |
| 4 | 0 | −2.137347E−12 | 1.576583E−09 | 2.373762E−11 |
| 2 | 2 | −1.837288E−11 | 3.942575E−10 | 3.477697E−11 |
| 0 | 4 | 2.267695E−10 | −5.188762E−10 | 3.055783E−10 |
| 4 | 1 | 1.411105E−16 | −1.724510E−12 | 9.305958E−15 |
| 2 | 3 | −3.006451E−14 | −2.584908E−15 | −4.187035E−15 |
| 0 | 5 | 2.191854E−13 | 1.007881E−12 | 1.758111E−13 |
| 6 | 0 | −6.778817E−19 | 1.544561E−14 | 2.458170E−17 |
| 4 | 2 | −1.427381E−18 | 4.584612E−15 | −2.158641E−17 |
| 2 | 4 | −8.239394E−18 | −2.450956E−15 | 1.016659E−16 |
| 0 | 6 | −1.614558E−15 | −3.050994E−15 | 2.666053E−15 |
| 6 | 1 | 1.229438E−22 | 1.903495E−18 | −1.293245E−20 |
| 4 | 3 | −3.260326E−21 | −6.998785E−18 | 5.716527E−20 |
| 2 | 5 | 1.066140E−18 | 5.391403E−18 | 3.445202E−19 |
| 0 | 7 | −1.359181E−17 | −1.264277E−17 | 3.657134E−18 |
| 8 | 0 | 4.816885E−24 | −1.213292E−19 | 8.234300E−24 |
| 6 | 2 | −8.175529E−24 | 4.383991E−21 | 4.993492E−23 |
| 4 | 4 | −1.926532E−22 | −5.565056E−20 | −2.156128E−22 |
| 2 | 6 | 8.626242E−21 | −2.581936E−20 | 5.986964E−22 |
| 0 | 8 | −7.089725E−20 | 6.143405E−20 | 1.739717E−20 |
| 8 | 1 | −3.771838E−28 | −4.831911E−21 | 2.070941E−26 |
| 6 | 3 | −2.467530E−25 | −1.853022E−22 | 3.686364E−26 |
| 4 | 5 | −2.067173E−24 | 1.175842E−21 | 1.137469E−24 |
| 2 | 7 | 3.568664E−23 | 1.225900E−22 | 3.713734E−24 |
| 0 | 9 | −2.670172E−22 | 7.581270E−23 | 1.802866E−23 |
| 10 | 0 | −5.065212E−29 | 3.391451E−23 | −7.392261E−29 |
| 8 | 2 | −1.067668E−28 | 1.185370E−23 | −1.117330E−28 |
| 6 | 4 | −1.872127E−27 | −2.022360E−24 | 8.205644E−28 |
| 4 | 6 | −1.028723E−26 | −2.410152E−24 | 4.422002E−27 |
| 2 | 8 | 8.492357E−26 | 5.882668E−25 | 3.267136E−27 |
| 0 | 10 | −6.387968E−25 | −3.445495E−25 | 1.431086E−25 |
| 10 | 1 | 3.666261E−33 | 2.883105E−25 | −1.072074E−31 |
| 8 | 3 | −4.752261E−32 | 1.142700E−25 | −6.397976E−31 |
| 6 | 5 | −6.241023E−30 | −4.037210E−26 | −2.511357E−30 |
| 4 | 7 | −2.455038E−29 | −3.207115E−26 | −1.129131E−29 |
| 2 | 9 | 1.085598E−28 | −4.260379E−27 | 2.275709E−29 |
| 0 | 11 | −8.545257E−28 | −3.189597E−28 | 1.637442E−28 |
| 12 | 0 | 1.946525E−34 | −1.688051E−27 | 3.666833E−35 |
| 10 | 2 | 5.250159E−34 | −1.557158E−27 | 2.755154E−34 |
| 8 | 4 | 2.347106E−34 | −2.996294E−28 | −7.646174E−34 |
| 6 | 6 | −7.828036E−33 | 2.251620E−28 | −9.722412E−33 |
| 4 | 8 | −2.246803E−32 | 1.179144E−28 | −6.361255E−33 |
| 2 | 10 | 5.730200E−32 | 4.993855E−30 | −1.842500E−32 |
| 0 | 12 | −4.876217E−31 | 7.956309E−31 | 2.079404E−31 |
| 12 | 1 | 0.000000E+00 | 0.000000E+00 | 0.000000E+00 |
| 10 | 3 | 0.000000E+00 | 0.000000E+00 | 0.000000E+00 |
| 8 | 5 | 0.000000E+00 | 0.000000E+00 | 0.000000E+00 |
| 6 | 7 | 0.000000E+00 | 0.000000E+00 | 0.000000E+00 |
| 4 | 9 | 0.000000E+00 | 0.000000E+00 | 0.000000E+00 |
| 2 | 11 | 0.000000E+00 | 0.000000E+00 | 0.000000E+00 |
| 0 | 13 | 0.000000E+00 | 0.000000E+00 | 0.000000E+00 |
| 14 | 0 | 0.000000E+00 | 0.000000E+00 | 0.000000E+00 |
| 12 | 2 | 0.000000E+00 | 0.000000E+00 | 0.000000E+00 |
| 10 | 4 | 0.000000E+00 | 0.000000E+00 | 0.000000E+00 |
| 8 | 6 | 0.000000E+00 | 0.000000E+00 | 0.000000E+00 |
| 6 | 8 | 0.000000E+00 | 0.000000E+00 | 0.000000E+00 |
| 4 | 10 | 0.000000E+00 | 0.000000E+00 | 0.000000E+00 |
| 2 | 12 | 0.000000E+00 | 0.000000E+00 | 0.000000E+00 |
| 0 | 14 | 0.000000E+00 | 0.000000E+00 | 0.000000E+00 |
| Thickness (z distance from the preceding surface) | | 1902.297962 | −1490.995225 | 1476.659526 |
| y distance from the object field center | | −49.046994 | −550.251595 | −759.171070 |
| Tilting with respect to the object plane | | −5.668638 | −1.673681 | −1.975004 |

|   |   | M4 | M5 | M6 |
|---|---|---|---|---|
|   |   | $r_x$ | | |
|   |   | 100336.23970 | −15290.622359 | −3210.083002 |
|   |   | $r_y$ | | |
|   |   | 2656.137727 | −4201.741843 | −3419.931439 |
|   |   | $k_x$ | | |
|   |   | 0.000000 | 0.000000 | 0.000000 |
|   |   | $k_y$ | | |
| m | n | 0.000000 | 0.000000 | 0.000000 |
| 2 | 0 | 0.000000E+00 | 0.000000E+00 | 0.000000E+00 |
| 0 | 2 | 0.000000E+00 | 0.000000E+00 | 0.000000E+00 |
| 2 | 1 | −1.438956E−07 | 3.098640E−08 | −9.129475E−09 |
| 0 | 3 | −3.673069E−07 | −3.344228E−09 | 1.285967E−08 |
| 4 | 0 | −1.797405E−11 | 7.878368E−12 | 7.200110E−13 |
| 2 | 2 | 3.460064E−11 | −6.659880E−13 | 9.073031E−12 |
| 0 | 4 | 1.345677E−09 | 6.620915E−12 | −5.051309E−13 |
| 4 | 1 | 3.522872E−14 | 6.112639E−15 | −3.959748E−15 |
| 2 | 3 | 2.034193E−13 | 1.412806E−14 | −8.532851E−15 |
| 0 | 5 | −4.705329E−12 | −8.621392E−15 | −2.637197E−15 |

-continued

| | | | | |
|---|---|---|---|---|
| 6 | 0 | −1.812297E−18 | 2.351916E−18 | −6.488605E−19 |
| 4 | 2 | −7.620575E−17 | 8.229747E−19 | 4.065946E−18 |
| 2 | 4 | −2.926886E−16 | −3.624481E−17 | 1.440477E−17 |
| 0 | 6 | 2.601343E−14 | −2.809417E−17 | −1.973996E−17 |
| 6 | 1 | −2.439528E−20 | 8.110600E−22 | 7.368614E−22 |
| 4 | 3 | 8.763643E−19 | −5.475462E−20 | 3.639762E−20 |
| 2 | 5 | 8.301661E−18 | −1.078993E−19 | 7.939100E−20 |
| 0 | 7 | 1.302419E−16 | 6.527700E−20 | −1.938594E−19 |
| 8 | 0 | 6.673495E−24 | −9.717652E−25 | 2.934103E−25 |
| 6 | 2 | 2.038583E−22 | −2.934558E−23 | 1.793573E−23 |
| 4 | 4 | −3.502464E−21 | −1.542973E−22 | 1.206746E−22 |
| 2 | 6 | −3.608492E−20 | 3.050059E−22 | −2.609637E−23 |
| 0 | 8 | −5.991457E−19 | 5.733610E−22 | −6.408060E−22 |
| 8 | 1 | 1.293247E−26 | −4.264643E−27 | −3.804914E−27 |
| 6 | 3 | −1.218865E−24 | −4.340991E−26 | −4.165966E−26 |
| 4 | 5 | 5.865533E−24 | 4.998002E−25 | −4.710885E−25 |
| 2 | 7 | 3.181124E−23 | 1.089111E−24 | 6.979757E−25 |
| 0 | 9 | −6.497050E−21 | 2.271563E−25 | 1.685307E−24 |
| 10 | 0 | 9.801506E−31 | −2.424058E−30 | 1.519491E−30 |
| 8 | 2 | −2.271950E−28 | −1.268025E−29 | −4.995945E−29 |
| 6 | 4 | 5.266834E−28 | 4.910462E−28 | −6.359399E−28 |
| 4 | 6 | 1.050254E−25 | 1.353671E−27 | −1.557900E−27 |
| 2 | 8 | −9.343916E−25 | −1.221365E−27 | 6.484439E−27 |
| 0 | 10 | −5.538717E−24 | −1.823688E−27 | 9.756417E−27 |
| 10 | 1 | −1.033323E−32 | −1.390152E−32 | 9.460123E−33 |
| 8 | 3 | 1.084791E−30 | 1.281271E−31 | −3.515593E−31 |
| 6 | 5 | 2.347815E−29 | 1.067646E−30 | −4.711903E−31 |
| 4 | 7 | −5.076392E−28 | −7.562915E−31 | −4.064752E−30 |
| 2 | 9 | 3.339207E−27 | −3.874430E−30 | 1.852960E−29 |
| 0 | 11 | 2.201987E−25 | −2.411155E−30 | 6.965901E−30 |
| 12 | 0 | −2.991498E−36 | −9.069795E−38 | −1.910293E−37 |
| 10 | 2 | 1.071804E−34 | −1.489314E−35 | 1.189206E−35 |
| 8 | 4 | 9.092280E−33 | 3.146414E−34 | −6.776575E−34 |
| 6 | 6 | −1.469020E−31 | −3.722048E−34 | 2.934078E−33 |
| 4 | 8 | −2.473502E−30 | 4.883090E−34 | −1.632273E−32 |
| 2 | 10 | 2.794005E−30 | −5.576276E−33 | 4.066560E−32 |
| 0 | 12 | −4.326214E−28 | 2.432842E−33 | −2.671447E−32 |
| 12 | 1 | 0.000000E+00 | 0.000000E+00 | 0.000000E+00 |
| 10 | 3 | 0.000000E+00 | 0.000000E+00 | 0.000000E+00 |
| 8 | 5 | 0.000000E+00 | 0.000000E+00 | 0.000000E+00 |
| 6 | 7 | 0.000000E+00 | 0.000000E+00 | 0.000000E+00 |
| 4 | 9 | 0.000000E+00 | 0.000000E+00 | 0.000000E+00 |
| 2 | 11 | 0.000000E+00 | 0.000000E+00 | 0.000000E+00 |
| 0 | 13 | 0.000000E+00 | 0.000000E+00 | 0.000000E+00 |
| 14 | 0 | 0.000000E+00 | 0.000000E+00 | 0.000000E+00 |
| 12 | 2 | 0.000000E+00 | 0.000000E+00 | 0.000000E+00 |
| 10 | 4 | 0.000000E+00 | 0.000000E+00 | 0.000000E+00 |
| 8 | 6 | 0.000000E+00 | 0.000000E+00 | 0.000000E+00 |
| 6 | 8 | 0.000000E+00 | 0.000000E+00 | 0.000000E+00 |
| 4 | 10 | 0.000000E+00 | 0.000000E+00 | 0.000000E+00 |
| 2 | 12 | 0.000000E+00 | 0.000000E+00 | 0.000000E+00 |
| 0 | 14 | 0.000000E+00 | 0.000000E+00 | 0.000000E+00 |
| Thickness (z distance from the preceding surface) | | −1507.910764 | 1475.749284 | −1527.608156 |
| y distance from the object field center | | −1103.542199 | −1231.232842 | −1632.177568 |
| Tilting with respect to the object plane | | −4.277427 | −5.315006 | −0.574667 |

-continued

| | | M7 | M8 | |
|---|---|---|---|---|
| | | $r_x$ | | |
| | | 1187.722421 | −740.503750 | |
| | | $r_y$ | | |
| | | 387.205027 | −767.036620 | |
| | | $k_x$ | | |
| | | 0.000000 | −0.016211 | |
| | | $k_y$ | | |
| m | n | 0.000000 | 0.051169 | Image plane |
| 2 | 0 | 0.000000E+00 | 3.385150E−05 | |
| 0 | 2 | 0.000000E+00 | −6.109312E−06 | |
| 2 | 1 | −1.688554E−06 | −2.836524E−08 | |
| 0 | 3 | 8.229715E−07 | −1.524556E−08 | |
| 4 | 0 | 1.923417E−09 | 1.791610E−11 | |
| 2 | 2 | 6.347176E−10 | 7.771869E−12 | |
| 0 | 4 | 3.094702E−09 | −1.093951E−11 | |
| 4 | 1 | −7.553180E−12 | −1.429481E−14 | |
| 2 | 3 | −1.976561E−11 | −5.201848E−14 | |
| 0 | 5 | 1.171840E−11 | −2.252720E−14 | |
| 6 | 0 | 1.085304E−14 | 1.397087E−17 | |
| 4 | 2 | 2.890708E−14 | 3.119527E−17 | |
| 2 | 4 | 9.265014E−15 | −3.375714E−17 | |
| 0 | 6 | −5.550187E−14 | −1.883925E−17 | |
| 6 | 1 | −8.149072E−17 | −1.255668E−20 | |
| 4 | 3 | −2.331328E−16 | −5.898844E−20 | |
| 2 | 5 | 5.242395E−18 | −1.090902E−19 | |
| 0 | 7 | −4.046463E−16 | −3.133373E−20 | |
| 8 | 0 | 2.112696E−19 | 9.526691E−24 | |
| 6 | 2 | 3.794904E−19 | 5.754954E−23 | |
| 4 | 4 | −5.005717E−19 | −1.082958E−23 | |
| 2 | 6 | −8.488029E−19 | −7.716072E−23 | |
| 0 | 8 | −2.189614E−18 | −3.856608E−23 | |
| 8 | 1 | −7.560883E−22 | 3.806419E−27 | |
| 6 | 3 | −7.205419E−21 | −5.120764E−27 | |
| 4 | 5 | −9.544296E−21 | −1.865377E−25 | |
| 2 | 7 | −1.167227E−20 | −2.271921E−25 | |
| 0 | 9 | −2.902135E−20 | −6.208788E−26 | |
| 10 | 0 | −2.173719E−24 | 4.945905E−29 | |
| 8 | 2 | −1.375801E−23 | 1.714311E−28 | |
| 6 | 4 | −2.277808E−23 | 2.066519E−28 | |
| 4 | 6 | 6.992054E−23 | −6.830632E−29 | |
| 2 | 8 | 3.203085E−23 | −2.028481E−28 | |
| 0 | 10 | −1.400073E−22 | −5.268415E−29 | |
| 10 | 1 | −1.364074E−26 | 3.204785E−32 | |
| 8 | 3 | 5.783631E−26 | −1.432643E−31 | |
| 6 | 5 | 2.877253E−25 | −3.722697E−31 | |
| 4 | 7 | 7.565479E−25 | −3.936696E−31 | |
| 2 | 9 | 3.587110E−25 | −1.950611E−31 | |
| 0 | 11 | −5.103408E−25 | −5.400697E−32 | |
| 12 | 0 | 4.938432E−29 | 1.679132E−35 | |
| 10 | 2 | 6.285447E−28 | 8.753602E−35 | |
| 8 | 4 | 2.363505E−27 | −2.318734E−34 | |
| 6 | 6 | 3.213678E−27 | −8.160300E−34 | |
| 4 | 8 | 2.451619E−27 | −8.474659E−34 | |
| 2 | 10 | 9.178940E−28 | −5.049766E−34 | |
| 0 | 12 | −1.517212E−27 | −1.148027E−34 | |
| 12 | 1 | 0.000000E+00 | 9.333505E−38 | |
| 10 | 3 | 0.000000E+00 | 7.954674E−37 | |
| 8 | 5 | 0.000000E+00 | 4.361804E−37 | |
| 6 | 7 | 0.000000E+00 | −1.482832E−36 | |
| 4 | 9 | 0.000000E+00 | −2.343623E−36 | |
| 2 | 11 | 0.000000E+00 | −1.324387E−36 | |
| 0 | 13 | 0.000000E+00 | −2.816244E−37 | |
| 14 | 0 | 0.000000E+00 | 2.619628E−41 | |
| 12 | 2 | 0.000000E+00 | 8.524913E−40 | |
| 10 | 4 | 0.000000E+00 | 3.081298E−39 | |
| 8 | 6 | 0.000000E+00 | 3.369584E−39 | |
| 6 | 8 | 0.000000E+00 | 9.657701E−40 | |
| 4 | 10 | 0.000000E+00 | −1.246766E−39 | |
| 2 | 12 | 0.000000E+00 | −9.210641E−40 | |
| 0 | 14 | 0.000000E+00 | −1.293832E−40 | |

-continued

| | | | |
|---|---|---|---|
| Thickness (z distance from the preceding surface) | 1827.040737 | −651.166988 | 701.772075 |
| y distance from the object field center | −2101.491511 | −1933.241554 | −1961.554854 |
| Tilting with respect to the object plane | 12.990735 | 8.255535 | −0.166717 |

The distance A between the object-side intermediate plane 19 and the image-side intermediate plane 21 is approximately 50% of the field distance FA in the case of the imaging optical unit 28 according to FIG. 6. The distance B between the object plane 5 and the object-side intermediate plane 19 is approximately 20% of the field distance FA. The distance C between the image-side intermediate plane 21 and the image field 8 (or the image field reference plane 22) is approximately 30% of the field distance FA in the case of the imaging optical unit 28.

In alternative embodiments of the imaging optical unit 7, the image-side numerical aperture can also be 0.55 or 0.5.

The image field 8 can have an extent (x by y) of 13 mm by 1 mm.

Other image field extents are also possible, which are at least 1 mm by 1 mm.

In order to produce a micro- or nanostructured component, the projection exposure apparatus 1 is used as follows: firstly, the reflection mask 10 or the reticle and the substrate or the wafer 11 are provided. Afterwards, a structure on the reticle 10 is projected onto a light-sensitive layer of the wafer 11 with the aid of the projection exposure apparatus. By developing the light-sensitive layer, a micro- or nano-structure is then produced on the wafer 11 and the microstructured component is thus produced.

What is claimed is:

1. An imaging optical unit configured to image an object field in an object plane into an image field in an image plane, the image field being a field distance from the object plane, the imaging optical unit comprising:
a plurality of mirrors,
wherein the imaging optical unit has an image-side numerical aperture of more than 0.5, and the imaging optical unit is a projection exposure imaging optical unit, and
wherein during use of the imaging optical unit:
the imaging optical unit has a wavefront aberration over the image field of a maximum of 0.3 nm;
the image field in at least one dimension has an extent of at least 10 mm;
the imaging optical unit includes an image region bounded by an image-side intermediate plane parallel to the object plane and an image field reference plane including a central image field point and parallel to the object plane;
the image-side intermediate plane is a plane at the largest distance from the object plane for which, as seen from a direction of the object field, used reflection surfaces of all mirrors which are a distance from the object plane that is at least half of the field distance are arranged beyond the image-side intermediate plane;
all odd mirrors in an imaging path are arranged in the image region; and
a last mirror in an imaging beam path of the imaging optical unit between the object field and the image field is the mirror which is closest to the image-side intermediate plane.

2. The imaging optical unit of claim 1, wherein:
beam path sections of the imaging beam path run between the object field and a first mirror in the imaging beam path, between mirrors which succeed one another directly in the imaging beam path, and between the last mirror in the imaging beam path and the image field;
an object region is bounded by the object plane and an object-side intermediate plane parallel thereto;
the object-side intermediate plane is a plane at a smallest distance from the object plane for which used reflection surfaces of all mirrors which are at a distance from the object plane that is less than half of the field distance are arranged between the object plane and the object-side intermediate plane;
an intermediate region is between the object-side intermediate plane and the image-side intermediate plane;
a distance between the object-side intermediate plane and the image-side intermediate plane is at least 40% of the field distance;
at least two beam path sections pass completely through the intermediate region; and
the last mirror upstream of the image field in the imaging beam path is arranged in the image region.

3. The imaging optical unit of claim 2, wherein a distance between the object plane and the object-side intermediate plane is at most 40% of the field distance.

4. The imaging optical unit of claim 3, wherein an extent of the image field in the image plane is at least 1 mm×1 mm.

5. The imaging optical unit of claim 3, wherein the image-side numerical aperture is at least 0.55.

6. The imaging optical unit of claim 2, wherein a distance between the image-side intermediate plane and an image field reference plane is at most 50% of the field distance.

7. The imaging optical unit of claim 6, wherein an extent of the image field in the image plane is at least 1 mm×1 mm.

8. The imaging optical unit of claim 2, wherein, during use of the imaging optical unit, a wavefront aberration over the image field is a maximum of 0.2 nm.

9. The imaging optical unit of claim 2, wherein, during use of the imaging optical unit, a distortion over the image field is a maximum of 0.3 nm.

10. The imaging optical unit of claim 2, wherein the image-side numerical aperture is at least 0.55.

11. The imaging optical unit of claim 2, wherein an extent of the image field in the image plane is at least 1 mm×1 mm.

12. The imaging optical unit of claim 1, wherein, during use of the imaging optical unit, a wavefront aberration over the image field is a maximum of 0.2 nm.

13. The imaging optical unit of claim 1, wherein, during use of the imaging optical unit, a distortion over the image field is a maximum of 0.3 nm.

14. The imaging optical unit of claim 1, wherein the image-side numerical aperture is at least 0.55.

15. The imaging optical unit of claim 1, wherein an extent of the image field in the image plane is at least 1 mm×1 mm.

16. An optical system, comprising:
an imaging optical unit according to claim 1; and
an illumination optical unit configured to guide the illumination light toward the object field of the imaging optical unit.

17. A projection exposure apparatus, comprising
an optical system, comprising:
   an imaging optical unit according to claim 1; and
   an illumination optical unit configured to guide the illumination light toward the object field of the imaging optical unit,
wherein the projection exposure apparatus is a projection lithography projection exposure apparatus.

18. The projection exposure apparatus of claim 17, further comprising a light source configured to generate the illumination and imaging light.

19. A method, comprising:
projecting a structure of a reticle onto a light-sensitive layer using a projection lithography projection exposure apparatus,
wherein the projection lithography projection exposure apparatus comprises:
   an imaging optical unit according to claim 1; and
   an illumination optical unit configured to guide the illumination light toward the object field of the imaging optical unit.

20. The imaging optical unit of claim 1, wherein, during use of the imaging optical unit, a distortion over the image field is a maximum of 0.3 nm.

* * * * *

UNITED STATES PATENT AND TRADEMARK OFFICE
CERTIFICATE OF CORRECTION

PATENT NO. : 9,459,539 B2  
APPLICATION NO. : 13/956770  
DATED : October 4, 2016  
INVENTOR(S) : Mann et al.

Page 1 of 1

It is certified that error appears in the above-identified patent and that said Letters Patent is hereby corrected as shown below:

In the Specification

Column 6, Line 29, delete "C," and insert -- $C_j$ --.

Column 15, Line 49, delete "sagital" and insert -- sagittal --.

Signed and Sealed this  
Twenty-eighth Day of February, 2017

Michelle K. Lee  
*Director of the United States Patent and Trademark Office*